US012742834B2

(12) United States Patent
Li et al.

(10) Patent No.: US 12,742,834 B2
(45) Date of Patent: Sep. 22, 2026

(54) COMPUTERIZED SIMULATION VALIDATION FOR FULL-SCALE TESTING

(71) Applicant: Zhejiang Huadian Equipment Testing and Research Institute Co. LTD., Zhejiang (CN)

(72) Inventors: Zhi Li, Zhejiang (CN); Shaofeng Yu, Zhejiang (CN); Dingfang Ke, Zhejiang (CN); Peibo Wang, Zhejiang (CN); Kan Sun, Zhejiang (CN); Weiqiang Lang, Zhejiang (CN); Haijiang Xu, Zhejiang (CN); Kelong Wang, Zhejiang (CN); Zhiyong Li, Zhejiang (CN); Kun Yu, Zhejiang (CN); Guangyao Ying, Zhejiang (CN); Xuqiang He, Zhejiang (CN); Yezhao Chen, Zhejiang (CN); Xiang Zhang, Zhejiang (CN); Mingxiao Du, Zhejiang (CN); Huijuan Gui, Zhejiang (CN); Hongling Hu, Zhejiang (CN); Biao Peng, Zhejiang (CN); Xubin Xiao, Zhejiang (CN)

(73) Assignee: Zhejiang Huadian Equipment Testing and Researching Institute Co., LTD., Zhejiang (CN)

( * ) Notice: Subject to any disclaimer, the term of this patent is extended or adjusted under 35 U.S.C. 154(b) by 428 days.

(21) Appl. No.: 18/232,951

(22) Filed: Aug. 11, 2023

(65) Prior Publication Data

US 2024/0133975 A1 Apr. 25, 2024
US 2024/0230788 A9 Jul. 11, 2024

(30) Foreign Application Priority Data

Oct. 25, 2022 (CN) ........................ 202211310194.6

(51) Int. Cl.
*G01R 31/52* (2020.01)
*G01R 31/58* (2020.01)

(52) U.S. Cl.
CPC ............ *G01R 31/52* (2020.01); *G01R 31/58* (2020.01)

(58) Field of Classification Search
CPC ...... G01R 31/52; G01R 31/58; G01R 31/086; G01R 35/00; H02J 3/00; H02J 2203/20
See application file for complete search history.

(56) References Cited

U.S. PATENT DOCUMENTS

2006/0167644 A1 7/2006 Muller
2018/0247001 A1 8/2018 Liu et al.

FOREIGN PATENT DOCUMENTS

CN 103954925 A 7/2014
CN 105158716 A * 12/2015

(Continued)

OTHER PUBLICATIONS

Machine translation of CN113740791A (Year: 2021).*

(Continued)

*Primary Examiner* — Lee E Rodak
*Assistant Examiner* — Sangkyung Lee
(74) *Attorney, Agent, or Firm* — The PL Law Group, PLLC

(57) ABSTRACT

A computerized simulation validating method for a full-scale distribution network single phase-to-ground fault test is implemented by simulating a full-scale test system with external quantities being controlled to be conformant and validating the full-scale distribution network single phase-to-ground fault test based on a conformance check result between the internal quantities of the field testing and the internal quantities of the simulation testing. The simulation validating method for a full-scale distribution network single (Continued)

obtain recorded waveforms and external characteristic parameters of field testing of the full-scale distribution network single phase-to-ground fault test — S10 obtain internal quantities of the field testing based on the recorded waveforms of the field testing — S11 obtain recorded waveforms of simulation testing based on external quantities — S12 obtain internal quantities of the simulation testing based on the recorded waveforms of the simulation testing — S13 determine whether a field-testing result of the full-scale distribution network single phase-to-ground fault test is reproducible based on a relationship between the internal quantities of the field testing and the internal quantities of the simulation testing — S14

No validate the field testing of the full-scale distribution network single phase-to-ground fault test in case of the field-testing result being not reproducible — S15 phase-to-ground fault test improves normalization and conformance of the full-scale distribution network ground fault test. The computerized simulation validating system, apparatus, and medium for a full-scale distribution network single phase-to-ground fault test also achieve the benefits noted above.

8 Claims, 24 Drawing Sheets

(56) References Cited

FOREIGN PATENT DOCUMENTS

| | | | | | |
|---|---|---|---|---|---|
| CN | 106093820 | A | * | 11/2016 | G01R 35/00 |
| CN | 108169610 | A | | 6/2018 | |
| CN | 108508399 | A | | 9/2018 | |
| CN | 109669103 | A | | 4/2019 | |
| CN | 109975657 | A | * | 7/2019 | G01R 31/086 |
| CN | 110389535 | A | * | 10/2019 | G05B 17/02 |
| CN | 110672945 | A | * | 1/2020 | G01R 31/00 |
| CN | 112305340 | A | | 2/2021 | |
| CN | 112731054 | A | * | 4/2021 | G01R 31/088 |
| CN | 113515813 | A | | 10/2021 | |
| CN | 113740791 | A | * | 12/2021 | G06F 30/20 |
| GB | 2529456 | A | | 2/2016 | |
| JP | 2021-132461 | A | | 9/2021 | |

OTHER PUBLICATIONS

Machine translation of CN110389535A (Year: 2019).*
Machine translation of CN112731054A (Year: 2021).*
Machine translation of Cn 109975657A (Year: 2019).*
Mahcnine translation of CN110672945A (Year: 2020).*
Mahcnine translation of CN106093820A (Year: 2016).*
Mahcnine translation of CN105158716A (Year: 2015).*
Duan Dapeng et al., "Design and Implementation of Experiment Platform for Power Equipment State Detection", High Voltage Apparatus, Jul. 16, 2017, vol. 53, No. 7, pp. 100-105, DOI: 10.13296/j.1001-1609. (English Abstract is included in the first page.).

* cited by examiner

COMPUTERIZED SIMULATION VALIDATION FOR FULL-SCALE TESTING

PRIORITY

This application claims the benefit under 35 USC § 119 of Chinese Patent Application No. 2022113101946, filed on Oct. 25, 2022, in the China Intellectual Property Office, the entire disclosure of which is incorporated herein by reference for all purposes.

BACKGROUND

1. Field

The subject matter described herein relates to the field of distribution automation, and more particularly relates to computerized simulation validation for full-scale testing.

2. Background Art

In recent years, various novel ground fault management technologies and equipment have emerged to address distribution network single phase-to-ground faults. In light of multiplicity of the factors leading to ground faults, the full-scale distribution network single phase-to-ground fault testing is currently an effective detection approach to verify such technologies and equipment. A full-scale distribution network single phase-to-ground fault test refers to a test which emulates artificial occurrence of a real-world ground fault at a testing site, where the testing site is configured to exactly resemble a real-world distribution network in terms of voltage grade, neutral grounded mode, characteristics of a fault point grounding medium, and capacitive current level, which are factors significantly impacting signatures of a single phase-to-ground fault. However, a new issue arises, i.e., how to validate conformance of a result of the full-scale distribution network single phase-to-ground fault test.

Currently, an objective validation approach adopts an all-round comparison without distinguishing quantities, which makes little sense in validation. A subjective validation approach is to validate reproducibility of a result of a full-scale distribution network single phase-to-ground fault test by manually comparing or simply estimating a waveform file created at the instant of fault occurrence; apparently, this approach lacks uniform criteria.

Therefore, a normative method for validating a result of a full-scale distribution network single phase-to-ground fault test is an issue that needs to be addressed by those skilled in the art.

SUMMARY

The subject matter disclosed herein provides a computerized simulation validating method, system, apparatus, and medium for full-scale testing, configured to serve a normalized validation to a full-scale distribution network single phase-to-ground test.

To solve the above and other technical problems, the disclosure provides a computerized simulation validating method for a full-scale distribution network single phase-to-ground fault test, comprising:

- obtaining recorded waveforms and external characteristic parameters of field testing of the full-scale distribution network single phase-to-ground fault test;
- obtaining internal quantities of the field testing based on the recorded waveforms of the field testing;
- obtaining recorded waveforms of simulation testing based on the external characteristic parameters;
- obtaining internal quantities of the simulation testing based on the recorded waveforms of the simulation testing;
- determining whether a field-testing result of the full-scale distribution network single phase-to-ground fault test is reproducible based on a relationship between the internal quantities of the field testing and the internal quantities of the simulation testing;
- validating the field testing of the full-scale distribution network single phase-to-ground fault test in case of the field-testing result being not reproducible.

Preferably, the internal quantities comprise three dimensions: steady-state quantities, transient quantities, and unconventional quantities.

Preferably, the steady-state quantities comprise: zero-sequence current and line zero-sequence admittance:

- the transient quantities comprise: harmonic current and transient zero-sequence component;
- the unconventional quantities comprise: negative-sequence current, line dielectric loss, phase current change, and multi-harmonic zero-sequence admittance.

Preferably, the external characteristic parameters comprise: system capacitive current value, harmonic content, load condition, ground fault resistance value, ground fault trigger angle.

Preferably, before determining whether a field-testing result of the full-scale distribution network single phase-to-ground fault test is reproducible based on a relationship between the internal quantities of the field testing and the internal quantities of the simulation testing, the computerized simulation validating method for a full-scale distribution network single phase-to-ground fault test further comprises:

- preprocessing the recorded waves of the field testing and the recorded waves of the simulation testing, respectively.

Preferably, the obtaining recorded waves of the simulation testing based on the external characteristic parameters comprises:

- inputting the external characteristic parameters into a simulation model; and
- obtaining the recorded waves of the simulation testing formed from the simulation model;
- a method of building the simulation model comprises:
- building the simulation model based on standard parameters of a standard full-scale distribution network single phase-to-ground fault test site and the recorded waveforms of a full-scale ground fault;
- wherein independent variables of the simulation model are the external characteristic parameters, and dependent variables thereof are the recorded waves of the simulation testing.

Preferably, the simulation model comprises: an equivalent power source, a step-down transformer, a grounding transformer, an arc suppression coil, a distribution line, a circuit load, and a fault trigger control module;

- building the simulation model based on standard parameters of the standard full-scale distribution network single phase-to-ground fault test site and the recorded waveforms of the full-scale ground fault comprises:
- adjusting parameters of the equivalent power source and the step-down transformer to maintain conformance with a value of pre-fault phase voltage, and adjusting a magnitude of the circuit load to maintain conformance with a value of pre-fault phase current;

adjusting parameters of the distribution line to maintain conformance between the system capacitive current of the simulation model and the system capacitive current of the standard full-scale distribution network single phase-to-ground fault test site;

completing simulation modeling of the grounding transformer in the simulation model based on grounding transformer nameplate information of the standard full-scale distribution network single phase-to-ground fault test site;

completing simulation modeling of the arc suppression coil in the simulation model based on arc suppression coil nameplate information of the standard full-scale distribution network single phase-to-ground fault test site;

determining a ground fault resistance value of the simulation model based on a ground fault resistance value of the standard full-scale distribution network single phase-to-ground fault test site; setting a ground fault point location of the simulation model based on fault point location information of the standard full-scale distribution network single phase-to-ground fault test; obtaining a full-scale fault trigger angle based on recorded waves of a ground fault of the standard full-scale distribution network single phase-to-ground fault test, and controlling a fault trigger angle of the simulation model to be conformant with the full-scale fault trigger angle; and completing simulation modeling of the fault trigger control module in the simulation model;

emulating occurrence of ground fault to the simulation model and recording waves, and determining whether the recorded waveforms of the ground fault of the simulation model and the recorded waveforms of the full-scale ground fault are conformant; and in case of being not conformant, adjusting the fault point location or the ground fault resistance value based on a comparison result, and returning to the step of emulating occurrence of ground fault to the simulation model and recording waves, till the recorded waveforms of the ground fault of the simulation model and the recorded waveforms of the full-scale ground fault are conformant;

simulation blocks classified as per sub-functions of the simulation model built according to the method comprises: an alternating-current AC equivalent power grid simulation block, a network topology simulation block, a system load simulation block, and a fault point simulation block, which are configured to implement simulations of respective simulation sub-functions based on the external characteristic parameters.

To solve the above and other technical problems, the disclosure further provides a computerized simulation validating system for a full-scale distribution network single phase-to-ground fault test, comprising:

a first obtaining device configured to obtain recorded waveforms and external characteristic parameters of field testing of the full-scale distribution network single phase-to-ground fault test;

a second obtaining device configured to obtain internal quantities of the field testing based on the recorded waveforms of the field testing;

a third obtaining device configured to obtain recorded waveforms of simulation testing based on the external characteristic quantities;

a fourth obtaining device configured to obtain internal quantities of the simulation testing based on the recorded waveforms of the simulation testing;

a determining device configured to determine whether a field-testing result of the full-scale distribution network single phase-to-ground fault test is reproducible based on a relationship between the internal quantities of the field testing and the internal quantities of the simulation testing; and a validating device configured to validate validating the field testing of the full-scale distribution network single phase-to-ground fault test in case of the field-testing result being not reproducible.

To solve the above and other technical problems, the disclosure also provides a computerized simulation validating apparatus for a full-scale distribution network single phase-to-ground fault test, comprising: a memory configured to store a computer program;

a processor configured to carrying out, when the computer program is executed, steps of the computerized simulation validating method for a full-scale distribution network single phase-to-ground.

To solve the above and other technical problems, the disclosure further provides a computer-readable memory medium, wherein a computer program is stored on the computer-readable memory medium, such that the computer program, when being executed by a processor, carries out steps of the computerized simulation validating method for a full-scale distribution network single phase-to-ground test.

The computerized simulation validating method for a full-scale distribution network single phase-to-ground fault test as disclosed in the disclosure is implemented by simulating a full-scale test system with external quantities being controlled to be conformant and validating the full-scale distribution network single phase-to-ground fault test based on a conformance check result between the internal quantities of the field testing and the internal quantities of the simulation testing. The simulation validating method for a full-scale distribution network single phase-to-ground fault test improves normalization and conformance of the full-scale distribution network ground fault test.

The computerized simulation validating system, apparatus, and medium for a full-scale distribution network single phase-to-ground fault test also achieve the benefits noted above.

BRIEF DESCRIPTION OF THE DRAWINGS

To illustrate example embodiments of the disclosure more clearly, the drawings that need to be used in the embodiments will be briefly introduced below. Apparently, the drawings described below are only some examples of the disclosure; to those skilled in the art, other drawings may also be derived from these example drawings without exercise of inventive work.

DETAILED DESCRIPTION

Hereinafter, the technical solutions in embodiments of the disclosure will be described clearly and comprehensively with reference to the accompanying drawings; apparently, the example embodiments described herein are only part of the embodiments of the disclosure, not all of them. Based on the example embodiments described herein, all other embodiments derived by those skilled in the art without exercise of inventive work fall within the scope of protection of the disclosure.

A core idea of the disclosure is to provide a computerized simulation validating method, system, apparatus, and medium for a full-scale test, which are configured to carry out a normative validation of a result of the full-scale distribution network single phase-to-ground test, so as to improve normalization and conformance of the full-scale distribution network ground fault test.

To enable those skilled in the art to better understand solutions of the disclosure, the disclosure will be described in detail through example embodiments with reference to the accompanying drawings.

Figure 1:
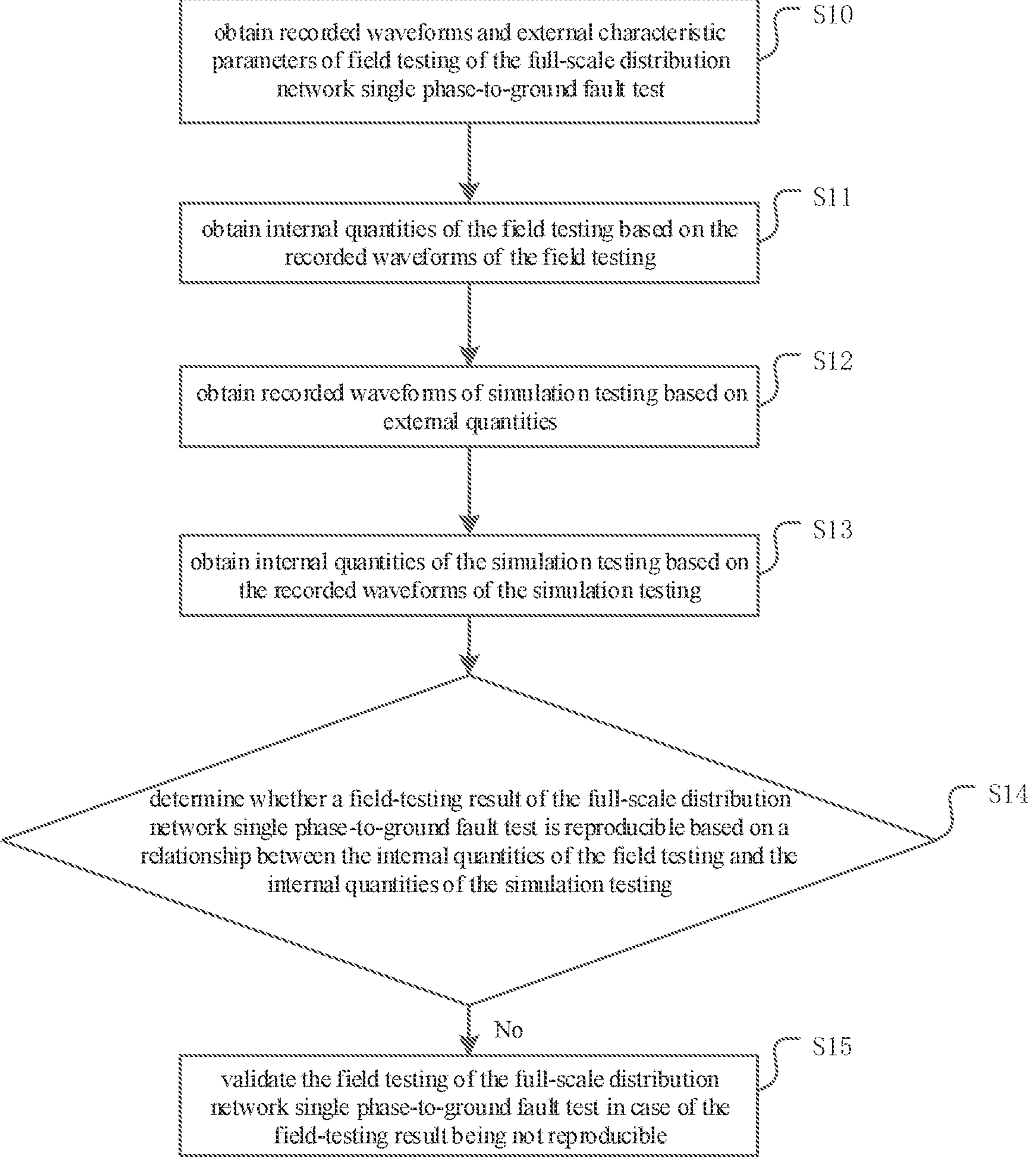
FIG. 1 is a flow diagram of a computerized simulation validating method for a full-scale distribution network single phase-to-ground fault test according to some example embodiments of the disclosure.

As illustrated in FIG. 1, which is a flow diagram of a computerized simulation validating method for a full-scale distribution network single phase-to-ground fault test according to some example embodiments of the disclosure, the computerized simulation validating method for a full-scale distribution network single phase-to-ground fault test according to some example embodiments of the disclosure comprises:

S10: obtain recorded waveforms and external characteristic parameters of field testing of the full-scale distribution network single phase-to-ground fault test.

In recent years, various novel ground fault management technologies and equipment have emerged to address distribution network single phase-to-ground faults. In light of multiplicity of the factors leading to ground faults, full-scale distribution network single phase-to-ground fault testing is currently an effective detection approach to verify such technologies and equipment. A full-scale distribution network single phase-to-ground fault test refers to a test which emulates artificial occurrence of a real-world ground fault at a testing site, where the testing site is configured to exactly resemble a real-world distribution network in terms of voltage grade, neutral grounded mode, characteristics of a fault point grounding medium, and capacitive current level, which are factors significantly impacting signatures of a single phase-to-ground fault, i.e., field testing of the full-scale distribution network single phase-to-ground fault test needs to reproduce a corresponding ground fault according to a preset plan, with field waves being recorded, whereby the recorded waves of the field testing are obtained.

Specific parameters of the external characteristic parameters include, for example, system capacitive current value, harmonic content, load condition, ground fault resistance value, ground fault trigger angle, which are not limited herein. External quantities are generally manually recorded and converted to external characteristic parameters adapted to a real-time data simulator (RTDS) system.

S11: obtain internal quantities of the field testing based on the recorded waveforms of the field testing.

Figure 3:
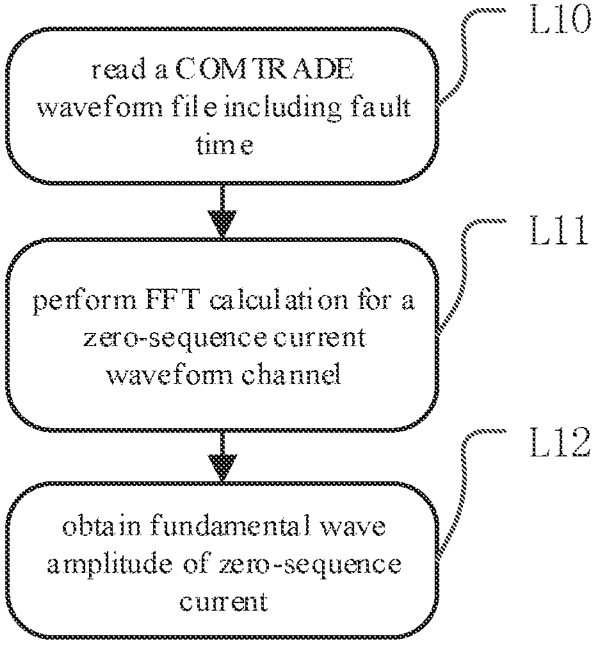
FIG. 3 is a flow diagram of a method of obtaining zero-sequence current according to some embodiments of the disclosure.

The system reads the recorded waves of the field testing including fault time so as to obtain internal quantities according to a preset algorithm, where the recorded waveforms generally have a file format of COMTRADE (Common Format for Transient Data Exchange). Specific parameters of the internal quantities include, but are not limited to, zero-sequence current, line zero-sequence admittance, harmonic current, transient zero-sequence component, negative-sequence current, line dielectric loss, phase current change, and multi-harmonic zero-sequence admittance, etc., which are not limited herein. Taking the zero-sequence current as an example, FIG. 3 illustrates a flow diagram of a method of obtaining zero-sequence current according to some example embodiments of the disclosure, where a process of obtaining the zero-sequence current comprises:

L10: read the COMTRADE file including fault time;

L11: perform FFT (Fast Fourier Transform) calculation for a zero-sequence current waveform channel; and L12: obtain fundamental wave amplitude of the zero-sequence current.

S12: obtain recorded waveforms of simulation testing based on external quantities.

Generally, the external characteristic parameters are manually inputted into a simulation model, and fault simulation is sequentially carried out according to testing sequence of a field-testing system employed by the full-scale distribution network single phase-to-ground fault test, whereby recorded waves of the simulation testing formed by the simulation model are obtained.

S13: obtain internal quantities of the simulation testing based on the recorded waveforms of the simulation testing.

This step is consistent with step S11, where the system reads the recorded waves of the field testing including fault time so as to obtain internal quantities according to preset algorithms corresponding to different internal quantities, where the recorded waveforms generally have a file format of COMTRADE (Common Format for Transient Data Exchange). Specific parameters of the internal quantities include, but are not limited to, zero-sequence current, line zero-sequence admittance, harmonic current, transient zero-sequence component, negative-sequence current, line dielectric loss, phase current change, and multi-harmonic zero-sequence admittance, etc., which are not limited herein.

S14: determine whether a field-testing result of the full-scale distribution network single phase-to-ground fault test is reproducible based on a relationship between the internal quantities of the field testing and the internal quantities of the simulation testing.

Through steps S10 to S13, the internal quantities of the field testing and the internal quantities of the simulation testing may be obtained with the external quantities being controlled to be conformant. The relationship between the internal quantities of the field testing and the internal quantities of the simulation testing is not limited herein. Preferably, the relationship may be a conformance relationship, for example, whether a field-testing result of the full-scale distribution network single phase-to-ground fault test is reproducible is determined by checking conformance between the internal quantities of the field testing and the internal quantities of the simulation testing; in case of good conformance, it indicates that the field-testing result of the full-scale distribution network single phase-to-ground fault test is reproducible; in case of poor conformance, it indicates that the field-testing result of the full-scale distribution network single phase-to-ground fault test is unreproducible.

S15: validate the field testing of the full-scale distribution network single phase-to-ground fault test in case of the field-testing result being not reproducible.

If the field-testing result of the full-scale distribution network single phase-to-ground fault test is unreproducible, field testing of the full-scale test needs to be validated.

The computerized simulation validating method for a full-scale distribution network single phase-to-ground fault test as disclosed in the disclosure is implemented by simulating a full-scale test system with external quantities being controlled to be conformant and validating the full-scale distribution network single phase-to-ground fault test based on a conformance check result between the internal quantities of the field testing and the internal quantities of the simulation testing. The simulation validating method for a full-scale distribution network single phase-to-ground fault test improves normalization and conformance of the full-scale distribution network ground fault test.

The example embodiment described above does not limit dimensions of internal quantities. As a preferable example, the internal quantities comprise three dimensions, i.e., steady-state quantities, transient quantities, and unconventional quantities.

Firstly, a traditional method of locating a steady-state quantity fault usually employs an industrial-frequency signal and a harmonic signal, which are cyclically steady, as fault signatures; this traditional method is simple in engineering application and easy to understand. However, due to the impacts from system grounding mode and transition resistance, a neutral point non-effectively grounded system has a high zero-sequence impedance and a small faulty current, such that a faulted line and an unfaulted line are not distinguished noticeably; therefore, the steady-state quantities have certain limitations in managing a neutral point non-effectively ground fault. In addition, the steady-state quantities have a relatively small amplitude, such that it is highly susceptible to interference during a transient oscillation process (e.g., a switching operation) and thus is easily drowned therein; in additional, the steady-state quantities are susceptible to CT (Current Transformer) imbalanced current, influencing a fault location result. Therefore, it is hard to give a representative description of the internal characteristics of a ground fault only using the steady-state quantities.

Moreover, at the early episode of a fault, its transient component is always couples or even dozens of times higher than the steady-state component; therefore, the frequency band and duration for monitoring the fault signature information may be extended to thereby describe the fault comprehensively by employing both transient and steady-state fault quantities.

However, since the transient fault quantity-based method usually selects a post-grounding time frame of dozens of milliseconds for the calculation, it has a drawback that in case of start delay or inconspicuous transient fault signature, the protective device can hardly act properly. Particularly for an intermittent arcing ground fault, it is generally accompanied with high resistance grounding, such that the transient fault signature created upon the first grounding is inconspicuous. Therefore, in some example embodiments of the disclosure, an unconventional quantity will be supplemented based on the steady-state and transient quantities so as to strengthen description of fault signatures in some special fault scenarios. The unconventional quantities include, for example, negative-sequence current, line dielectric loss, phase current change, and multi-harmonic zero-sequence admittance, which will be introduced below:

1) Negative-sequence current. The way a neutral point is grounded has no impact on a negative-sequence equivalent loop and thus does not affect distribution of negative-sequence current in a distribution network. However, the grounded manner dictates the magnitude of faulty residual current and in turn the magnitude of negative-sequence current of the ground fault; therefore, the faulty residual current will affect protection precision. Since the impedance and time constant of the negative-sequence loop of the neutral point non-effectively grounded system are far smaller than those of the zero-sequence loop, the oscillation attenuation time of the negative-sequence current is far less than that of the zero-sequence current, such that at the instant of arc extinguishing during arcing ground, the negative-sequence current disappears rapidly; therefore, the negative-sequence current grounding protection is less susceptible to arc oscillation, offering a strong anti-arcing ground protection capacity.

2) Line dielectric loss. Change in leakage resistance may be somewhat located by real-time monitoring the dielectric loss angle δ, while what is changed in the single phase-to-earth fault in distribution network is exactly the line-to-ground (L-G) transition resistance. Therefore, change of the dielectric loss angle δ may be employed to determine whether the line has a ground fault. Generally, in case of wet line or aged insulation, the dielectric loss angle δ of the faulted line changes noticeably. Therefore, the ground fault protection approach by measuring line dielectric loss offers a higher precision.

the system's eigen frequency band and then perform fault diagnosis based on the zero-sequence admittance phase angle at the eigen frequency.

The example embodiments of the disclosure comprehensively take into account various internal quantities in different fault episodes, as well as different fault scenarios, and supplement unconventional quantities based on the steady-state and transient quantities to strengthen description of fault signatures under some special fault scenarios, whereby representative description of internal characteristics of the ground fault is achieved.

Based on the example embodiments described above, specific parameters corresponding to the three dimensions of internal quantities are limited herein, where the steady-state quantities include: zero-sequence current, and line zero-sequence admittance;

the transient quantities include: harmonic current, and transient zero-sequence component;

the unconventional quantities include: negative-sequence current, line dielectric loss, phase current change, and multi-harmonic zero-sequence admittance.

Different fault quantities with three dimensions adopted in some example embodiments of the disclosure correspond to different applicable typical scenarios, as illustrated in Table 1:

TABLE 1

| Quantity dimension | Fault quantity | Applicable typical scenarios |
|---|---|---|
| steady-state | zero-sequence current | ungrounded system, low resistance grounding; small resistance grounded system, low resistance grounding; |
| | line zero-sequence admittance | Ungrounded system, high resistance grounding |
| transient | harmonic current | ungrounding, resonant grounding, low resistance grounding. |
| | transient zero-sequence component | ungrounding, resonant grounding, single phase-to-ground |
| unconventional | Negative-sequence current | Ungrounding, resonant grounding, arcing ground. |
| | line dielectric loss | resonant grounding, high resistance grounding |
| | phase current change | ungrounding, resonant grounding, resistance grounding |
| | Multi-harmonic zero-sequence admittance | resonant grounding, low resistance grounding |

3) Phase current change (phase-to-phase differential current). A calculated resistance is defined a ratio of the post-fault phase voltage to the phase-to-phase differential current with reference to the phase current; a value of the calculated resistance of a feeder is calculated, where the value of the calculated resistance of the feeder is used to determine whether the line is faulty; this approach is only required to measure the voltage and current of the protected line, which facilitates installation on a terminal unit at the power distribution automation site, whereby section-wise in-situ protection of the line is realized. This approach is suitable for high-resistance ground fault.

Figure 2:
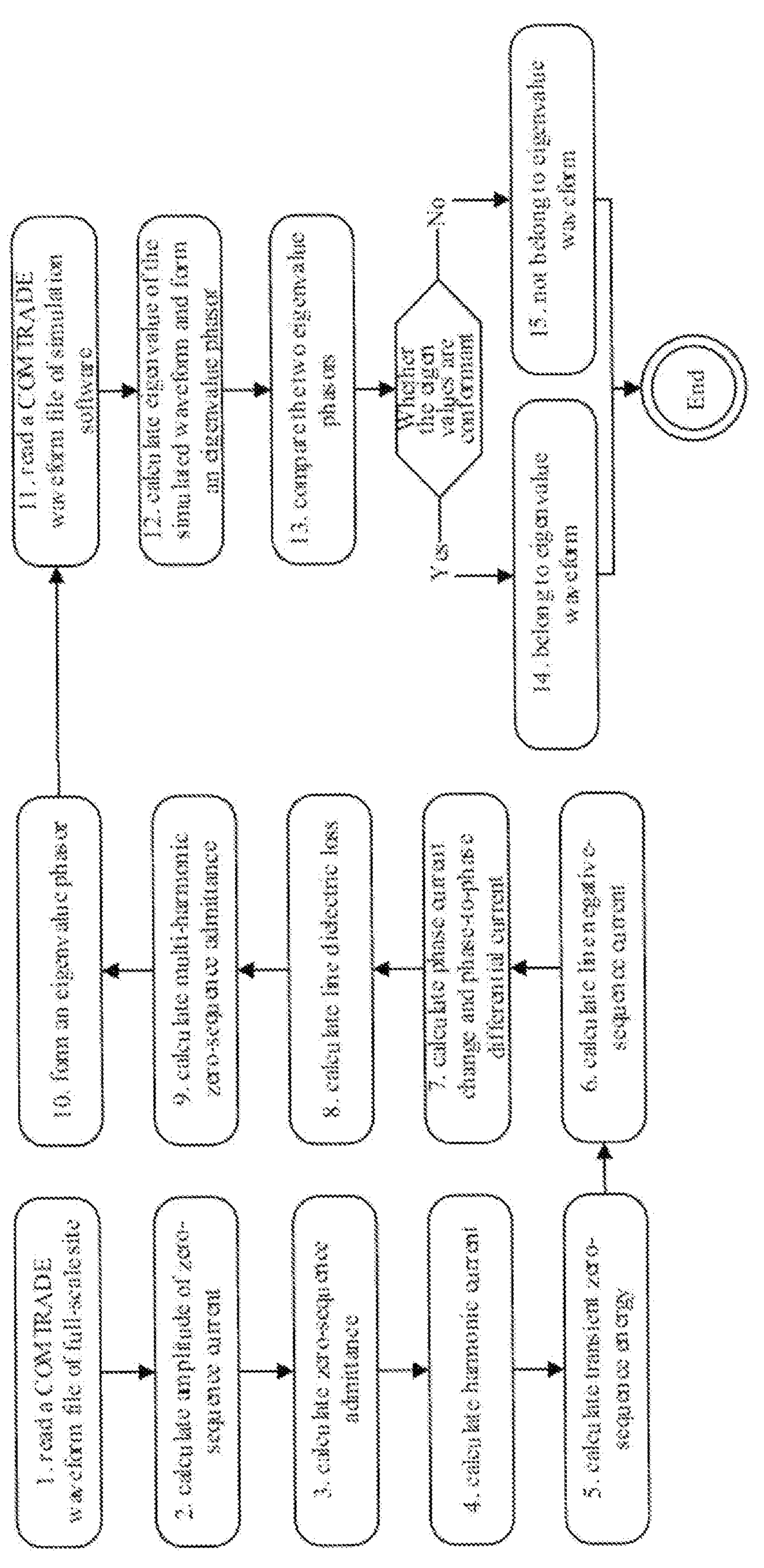
FIG. 2 is a flow diagram of a method of recognizing internal quantities according to some example embodiments of the disclosure.

4) Multi-harmonic zero-sequence admittance. The multi-harmonic zero-sequence admittance integrated directional protection method is similar to the industrial frequency zero-sequence admittance directional protection method, except that the admittance integrated directional protection approach needs to determine an eigen frequency based on FIG. 2 illustrates a practical application, showing a flow diagram of a method of recognizing internal quantities according to some example embodiments of the disclosure, where respective fault quantities are obtained in the following manners:

(1) Zero-sequence current. FIG. 3 is a flow diagram of a method of obtaining zero-sequence current according to some embodiments of the disclosure, where a process of obtaining the zero-sequence current comprises:

L10: reading a COMTRADE waveform file including fault time;

L11: performing FFT calculation for a zero-sequence current waveform channel; and L12: obtaining fundamental wave amplitude of zero-sequence current.

Figure 4:
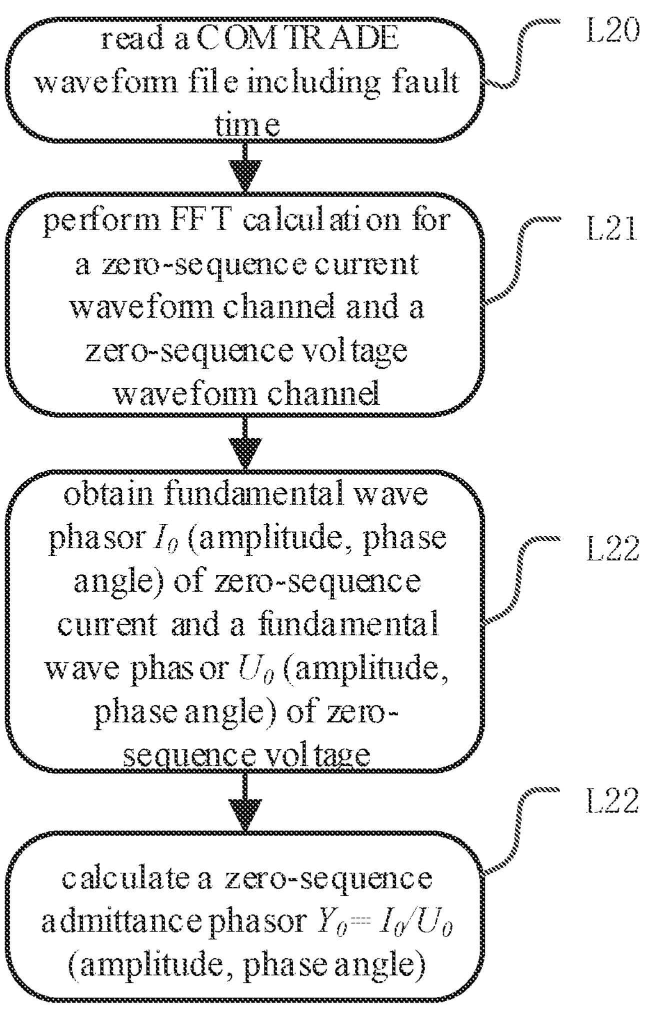
FIG. 4 is a flow diagram of a method of obtaining zero-sequence admittance according to some example embodiments of the disclosure.

(2) Zero-sequence admittance. FIG. 4 is a flow diagram of a method of obtaining zero-sequence admittance according to some example embodiments of the disclosure, where a process of obtaining the zero-sequence admittance comprises:

L20: reading a COMTRADE waveform file including fault time;

L21: performing FFT calculation for a zero-sequence current waveform channel and a zero-sequence voltage waveform channel;

L22: obtaining fundamental wave phasor $I_0$ (amplitude, phase angle) of zero-sequence current and a fundamental wave phasor $U_0$ (amplitude, phase angle) of zero-sequence voltage; and

L23: calculating a zero-sequence admittance phasor $Y_0=I_0/U_0$ (amplitude, phase angle).

Figure 5:
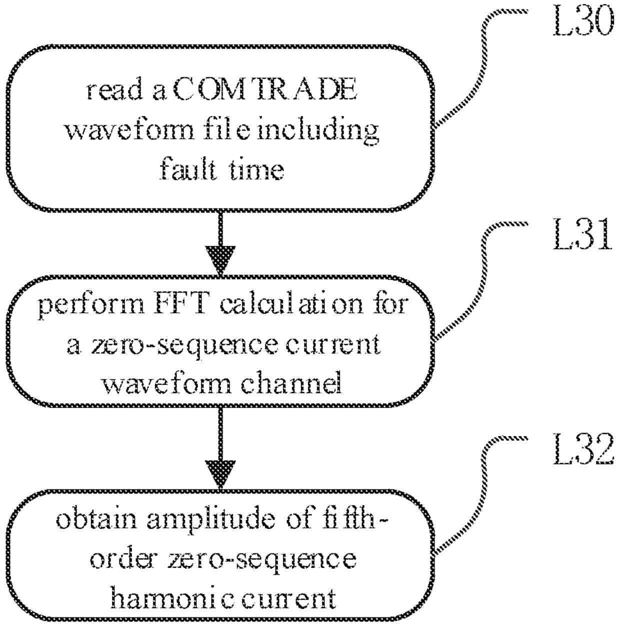
FIG. 5 is a flow diagram of a method of obtaining harmonic current according to some example embodiments of the disclosure.

(3) Harmonic current. FIG. 5 is a flow diagram of a method of obtaining harmonic current according to some example embodiments of the disclosure, where a process of obtaining the harmonic current comprises:

L30: reading a COMTRADE waveform file including fault time;

L31: performing FFT calculation for a zero-sequence current waveform channel; and

L32: obtaining amplitude of fifth-order zero-sequence harmonic current.

Figure 6:
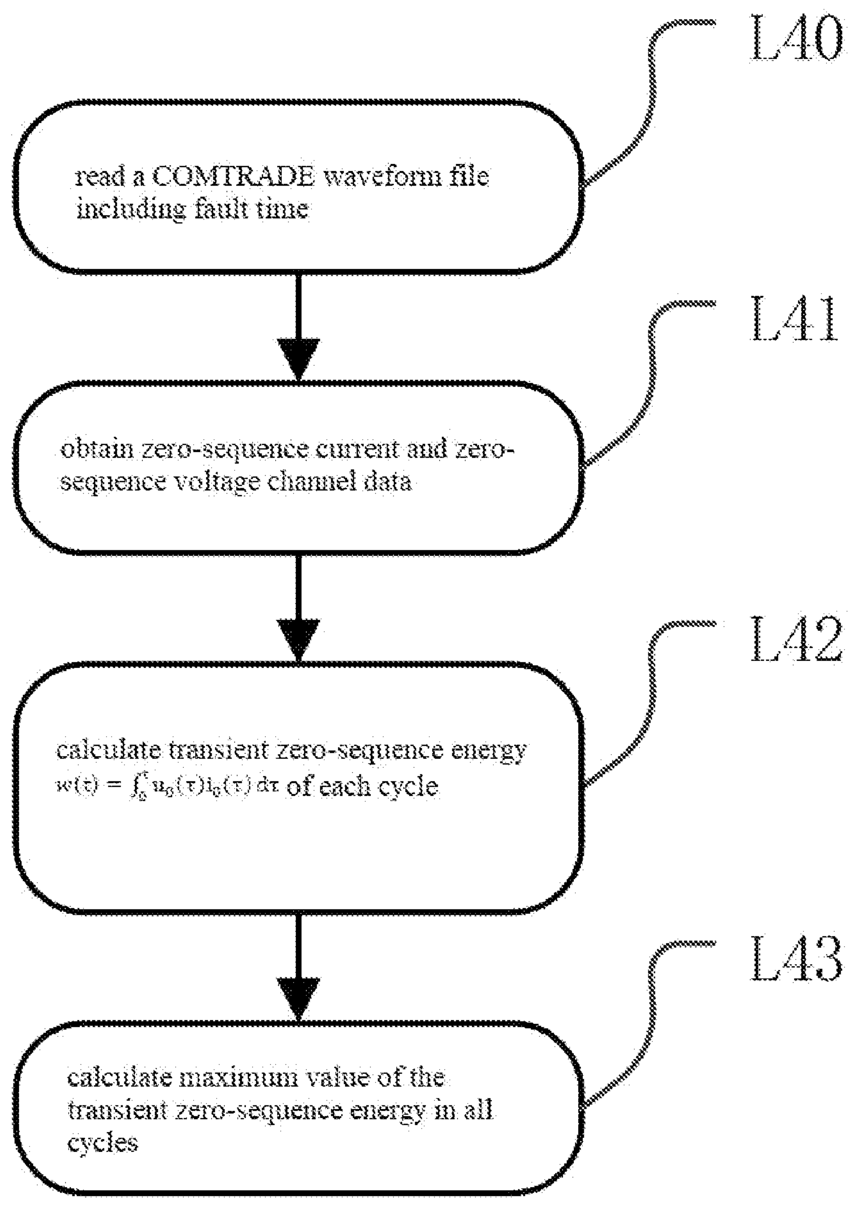
FIG. 6 is a flow diagram of a method of obtaining transient zero-sequence energy according to some example embodiments of the disclosure.

(4) Transient zero-sequence energy. FIG. 6 is a flow diagram of a method of obtaining transient zero-sequence energy according to some example embodiments of the disclosure, where a process of obtaining the transient zero-sequence energy comprises:

L40: reading a COMTRADE waveform file including fault time;

L41: obtaining zero-sequence current and zero-sequence voltage channel data;

L42: calculating transient zero-sequence energy $$w(t) = \int_0^T u_0(\tau) i_0(\tau) d\tau$$

of each cycle;

where t denotes duration of each cycle: τ denotes the time corresponding to the sample point in the cycle; $u_0(\tau)$ denotes the zero-sequence voltage sample value at time τ; and $i_0(\tau)$ denotes the zero-sequence voltage sample value at time τ; and

L43: calculating maximum value of the transient zero-sequence energy in all cycles.

Figure 7:
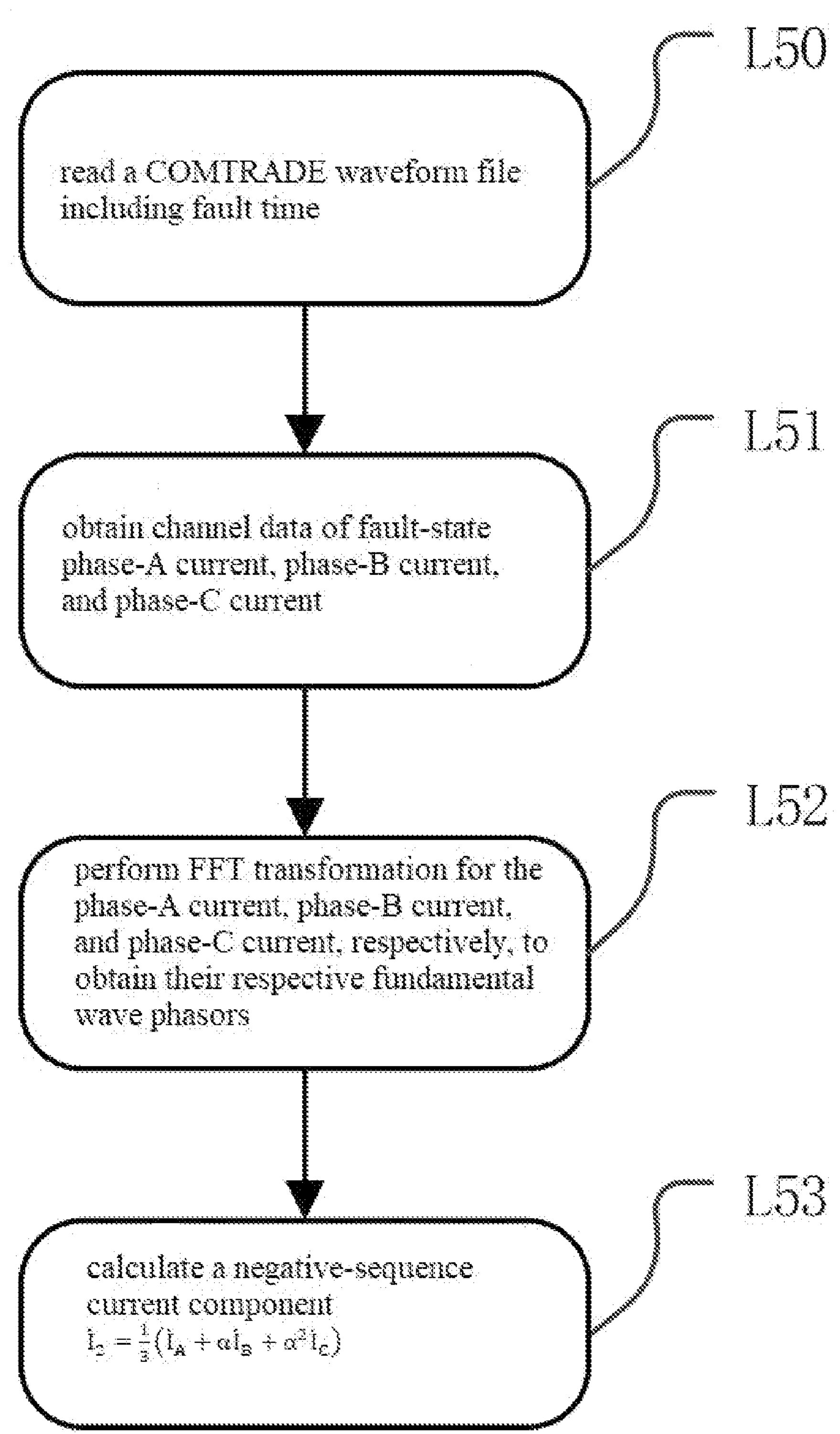
FIG. 7 is a flow diagram of a method of obtaining a line negative-sequence current according to some example embodiments of the disclosure.

(5) Line negative-sequence current: FIG. 7 is a flow diagram of a method of obtaining line negative-sequence current according to some example embodiments of the disclosure, where a process of obtaining the line negative-sequence current comprises:

L50: reading a COMTRADE waveform file including fault time;

L51: obtaining channel data of fault-state phase-A current, phase-B current, and phase-C current;

L52: performing FFT transformation for the phase-A current, phase-B current, and phase-C current, respectively, to obtain their respective fundamental wave phasors $\dot{I}_A$, $\dot{I}_B$, $\dot{I}_C$; and

L53: calculating a negative-sequence current component $$\dot{I}_2 = \frac{1}{3}(\dot{I}_A + \alpha \dot{I}_B + \alpha^2 \dot{I}_C).$$

Figure 8:
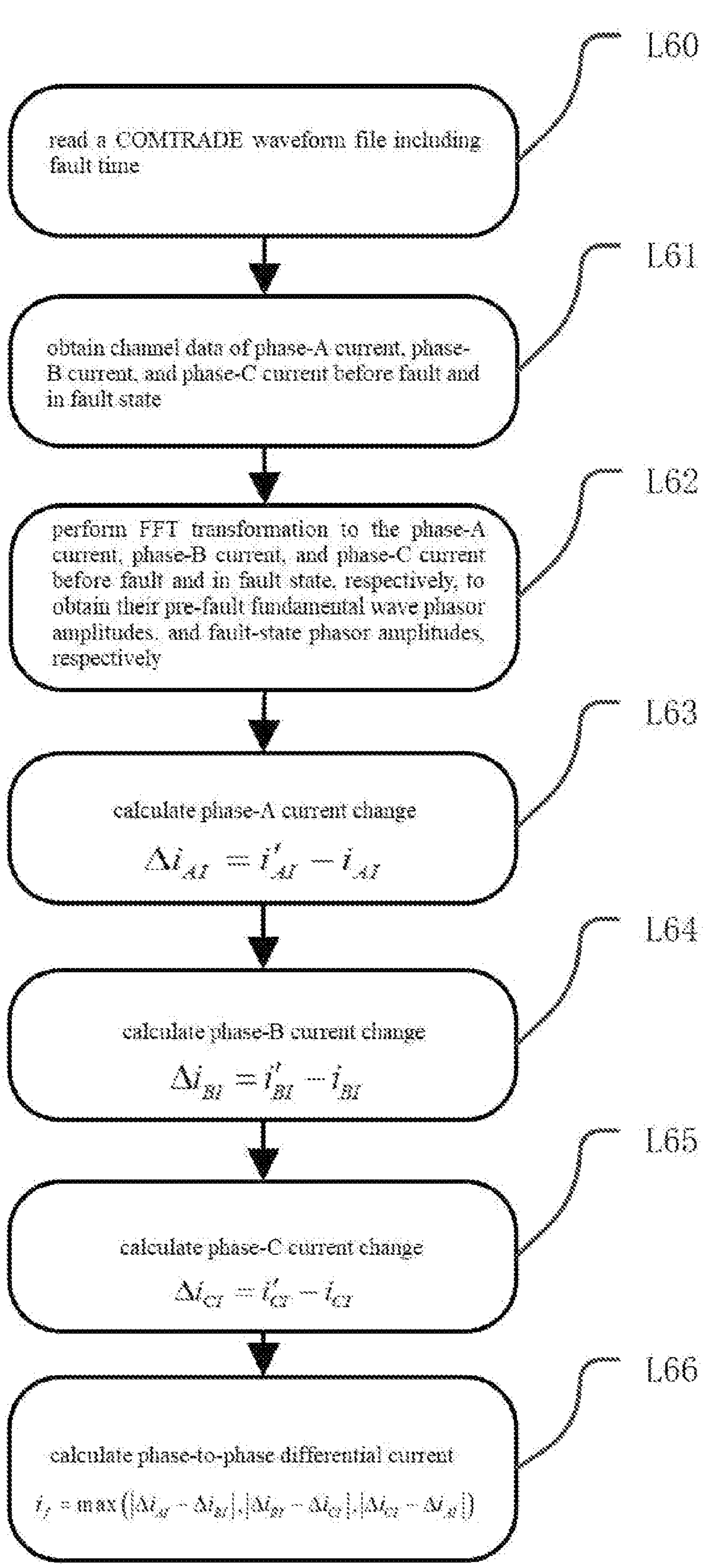
FIG. 8 is a flow diagram of a method of obtaining a phase current change according to some example embodiments of the disclosure.

(6) Phase current change. FIG. 8 is a flow diagram of a method of obtaining a phase current change according to some example embodiments of the disclosure, where a process of obtaining the phase current change comprises:

L60: reading a COMTRADE waveform file including fault time;

L61: obtaining channel data of phase-A current, phase-B current, and phase-C current before fault and in fault state;

L62: performing FFT transformation to the phase-A current, phase-B current, and phase-C current before fault and in fault state, respectively, to obtain their pre-fault fundamental wave phasor amplitudes $i_{AI}$, $i_{BI}$, $i_{CI}$, and fault-state phasor amplitudes $$i'_{AI}, i'_{BI}, i'_{CI},$$

respectively;

L63: calculating phase-A current change $$\Delta i_{AI} = i'_{AI} - i_{AI};$$

L64: calculating phase-B current change $$\Delta i_{BI} = i'_{BI} - i_{BI};$$

L65: calculating phase-C current change $$\Delta i_{CI} = i'_{CI} - i_{CI};$$

and

L66: calculating phase-to-phase differential current $i_f=\max(|\Delta i_{AI}-\Delta i_{BI}|, \Delta i_{BI}-\Delta i_{CI}|, |\Delta i_{CI}-\Delta i_{AI}|)$.

Figure 9:
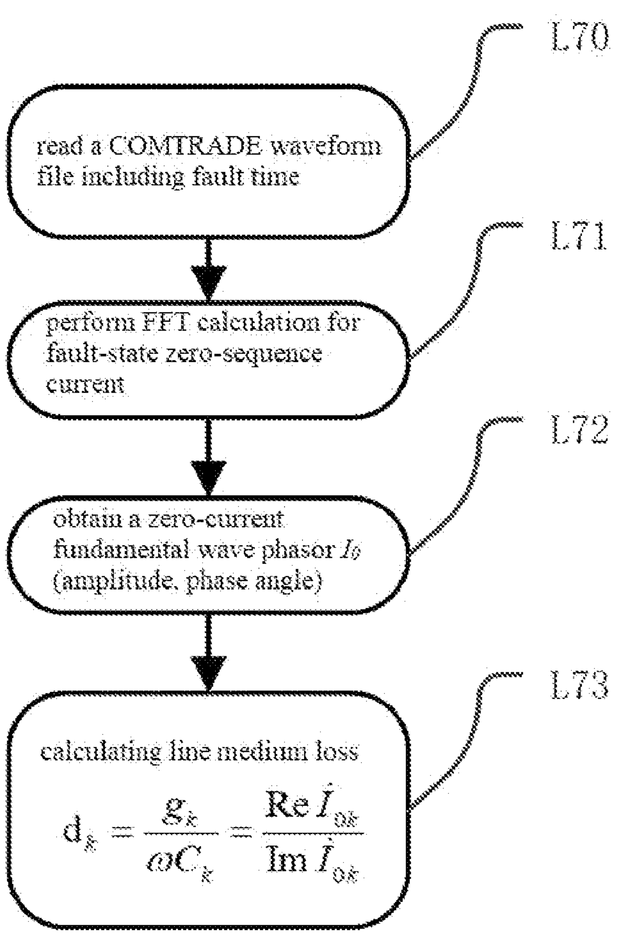
FIG. 9 is a flow diagram of a method of obtaining a line dielectric loss according to some example embodiments of the disclosure.

(7) Line dielectric loss. FIG. 9 is a flow diagram of a method of obtaining a line dielectric loss according to some example embodiments of the disclosure, where a process of obtaining the line dielectric loss comprises:

L70: reading a COMTRADE waveform file including fault time;

L71: performing FFT calculation for fault-state zero-sequence current;

L72: obtaining a zero-current fundamental wave phasor I0 (amplitude, phase angle); and

L73: calculating line medium loss $$d_k = \frac{g_k}{\omega C_k} = \frac{\text{Re}\dot{I}_{ok}}{\text{Im}\dot{I}_{ok}},$$

where $g_k$ denotes conductance of the $k^{th}$ line; ω denotes angular frequency; $C_k$ denotes the $k^{th}$ line to-ground capacitance; Re $\dot{I}_{ok}$ denotes the real part of zero-sequence current phasor of the $k^{th}$ line; and Im $\dot{I}_{ok}$ denotes the imaginary part of zero-sequence current phasor of the $k^{th}$ line.

Figure 10:
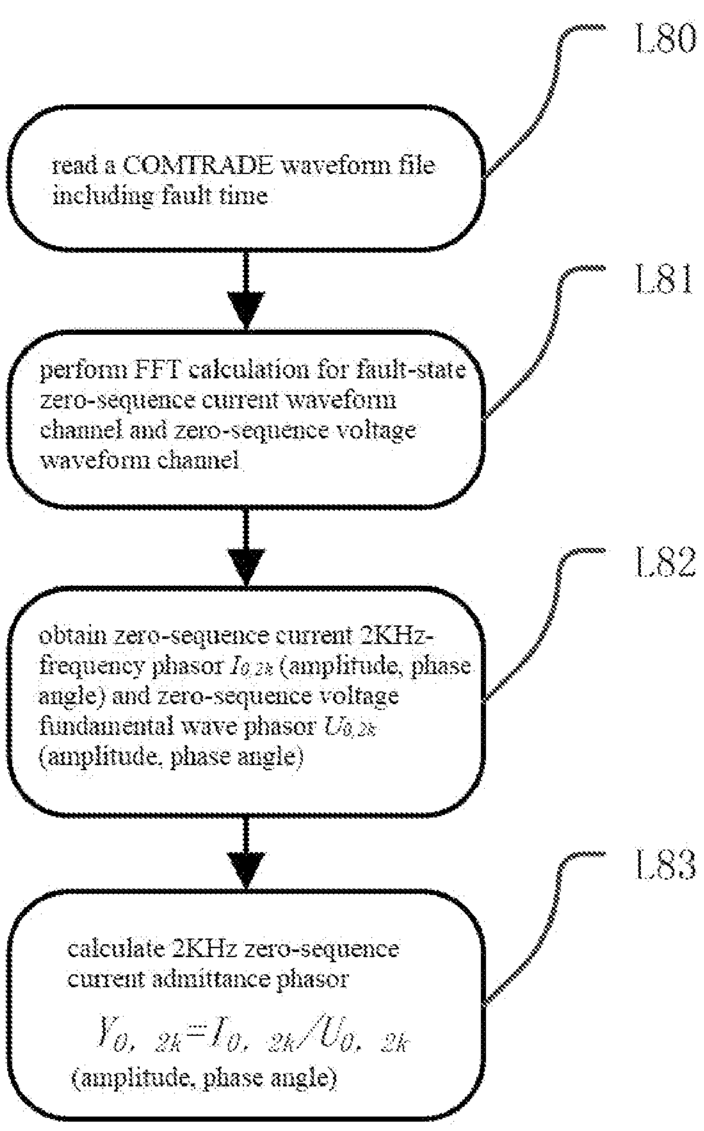
FIG. 10 is a flow diagram of a method of obtaining a multi-harmonic zero-sequence admittance according to some example embodiments of the disclosure.

(8) Multi-harmonic zero-sequence admittance. FIG. 10 is a flow diagram of a method of obtaining multi-harmonic zero-sequence admittance according to some example embodiments of the disclosure, where a process of obtaining the multi-harmonic zero-sequence admittance comprises:

L80: reading a COMTRADE waveform file including fault time;

L81: performing FFT calculation for fault-state zero-sequence current waveform channel and zero-sequence voltage waveform channel;

L82: obtaining zero-sequence current 2 KHz-frequency phasor $I_{0,\ 2k}$ (amplitude, phase angle) and zero-sequence voltage fundamental wave phasor $U_{0,2k}$ (amplitude, phase angle); and L83: calculating 2 KHz zero-sequence current admittance phasor $Y_{0,\ 2k}=I_{0,\ 2k}/U_{0,\ 2k}$ (amplitude, phase angle).

Example embodiments of the disclosure can satisfy demands of different scenarios through representative description of internal quantities including zero-sequence current, line zero-sequence admittance, harmonic current, transient zero-sequence component, negative-sequence current, line dielectric loss, phase current change, and multi-harmonic zero-sequence admittance.

The above example embodiments of the disclosure do not limit external characteristic parameters. As a preferred example of the disclosure, the external characteristic parameters include: system capacitive current value, harmonic content, loading condition, resistance value of ground fault, and trigger angle of ground fault.

The example embodiments of the disclosure limit that the external characteristic parameters include system capacitive current value, harmonic content, load condition, resistance value of ground fault, and trigger angle of ground fault, which are controlled to be conformant with the external characteristic parameters of the full-scale test.

As a preferred example of the disclosure, before determining whether a field-testing result of the full-scale distribution network single phase-to-ground fault test is reproducible based on a relationship between the internal quantities of the field testing and the internal quantities of the simulation testing, the method further comprises:

preprocessing the recorded waves of the field testing and the recorded waves of the simulation testing, respectively.

In actual applications, since the standards applied to various devices are different, the waveform file likely does not match the current system; by subjecting the waveform to normalization preprocessing, it is ensured that the waveform file is adapted to subsequent internal quantity location.

Based on the example embodiments above, preferably, the obtaining recorded waves of the simulation testing based on the external characteristic parameters comprises:

inputting the external characteristic parameters into a simulation model;

where the external characteristic parameters are manually converted from external quantities for being adapted to the simulation model, such that by inputting the external characteristic parameters into the simulation model, conformance between the external parameters of the simulation model and the external parameters of the full-scale test can be realized, ensuring reliability of the test result;

and obtaining the recorded waves of the simulation testing formed from the simulation model;

where the simulation model is a pre-built model, the independent variables of which are external characteristic parameters and the dependent variables of which are recorded waves of the simulation testing, such that after the external characteristic parameters are inputted into the simulation model, corresponding recorded waves of the simulation testing may be obtained.

A method of building the simulation model comprises a step of:

building the simulation model based on standard parameters of a standard full-scale distribution network single phase-to-ground fault test site and the recorded waveforms of a full-scale ground fault.

The ground fault of the simulation system is compared with the ground fault of the full-scale testing site are compared to ensure that measurement signals of the measured device are conformant or nearly conformant, where the measurement signals of the measured device mainly comprise: phase voltage, zero-sequence voltage, phase current, zero-sequence current, etc.; therefore, it is needed to build the simulation model based on the standard parameters of a standard full-scale distribution network single phase-to-ground fault test site and the recorded waveforms of the full-scale ground fault.

Here, the independent variables of the simulation model are external characteristic parameters, and the dependent variables thereof are recorded waves of the simulation testing.

In the example embodiments of the disclosure, the simulation model enables obtaining of the recorded waves of the simulation testing via external characteristic parameters, such that the obtained recorded waves of the simulation testing are accurate and reliable. The simulation model building method provided by the example embodiments of the disclosure assures conformance between the external quantities of the simulation model and the external quantities of the full-scale testing site.

The example embodiments described above do not limit the simulation model building method: the ground fault of the simulation system and the ground fault of the full-scale testing site are compared to ensure that the measurement signals of the measured device are conformant or nearly conformant, where the measurement signals of the measured device mainly include: phase voltage, zero-sequence voltage, phase current, and zero-sequence current. As per fault occurrence time, the measurement signals of the measured device may be classified into pre-fault state and in-fault state. The pre-fault state is mainly affected by system voltage and load, while the in-fault state is mainly affected by factors such as system capacitive current, ground fault resistance, and fault trigger angle. As a preferred example, the simulation model comprises: an equivalent power source, a step-down transformer, a grounding transformer, an arc suppression coil, a distribution line, a circuit load, and a fault trigger control module:

Where the method of building the simulation model based on standard parameters of the standard full-scale distribution network single phase-to-ground fault test site and the recorded waveforms of the full-scale ground fault comprises:

adjusting parameters of the equivalent power source and the step-down transformer to maintain conformance with a value of pre-fault phase voltage, and adjusting a magnitude of the circuit load to maintain conformance with a value of pre-fault phase current;

adjusting parameters of the distribution line to maintain conformance between the system capacitive current of the simulation model and the system capacitive current of the standard full-scale distribution network single phase-to-ground fault test site;

completing simulation modeling of the grounding transformer in the simulation model based on grounding transformer nameplate information of the standard full-scale distribution network single phase-to-ground fault test site.

completing simulation modeling of the arc suppression coil in the simulation model based on arc suppression coil nameplate information of the standard full-scale distribution network single phase-to-ground fault test site;

determining a ground fault resistance value of the simulation model based on a ground fault resistance value of the standard full-scale distribution network single phase-to-ground fault test site; setting a ground fault point location of the simulation model based on fault point location information of the standard full-scale distribution network single phase-to-ground fault test; obtaining a full-scale fault trigger angle based on recorded waves of a ground fault of the standard full-scale distribution network single phase-to-ground fault test, and controlling a fault trigger angle of the simulation model to be conformant with the full-scale fault trigger angle; and completing simulation modeling of the fault trigger control module in the simulation model;

emulating occurrence of ground fault to the simulation model and recording waves, and determining whether the recorded waveforms of the ground fault of the simulation model and the recorded waveforms of the full-scale ground fault are conformant;

in case of being not conformant, adjusting the fault point location or the ground fault resistance value based on a comparison result, and returning to the step of emulating occurrence of ground fault to the simulation model and recording waves, till the recorded waveforms of the ground fault of the simulation model and the recorded waveforms of the full-scale ground fault are conformant.

Figure 11:
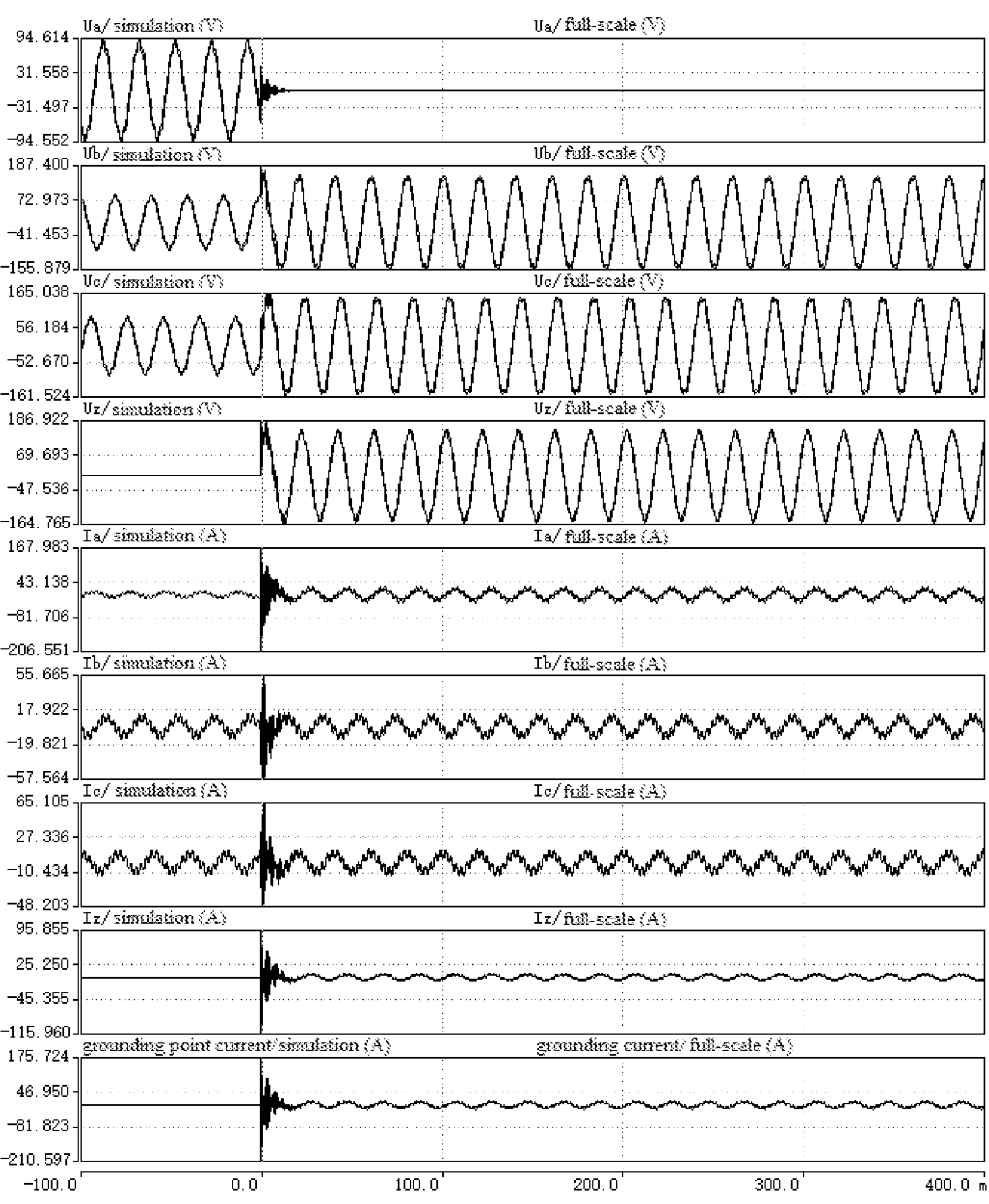
FIG. 11 is a full-scale simulated waveform comparison diagram of a metallic ground fault with neutral ungrounded according to some example embodiments of the disclosure.
Figure 12:
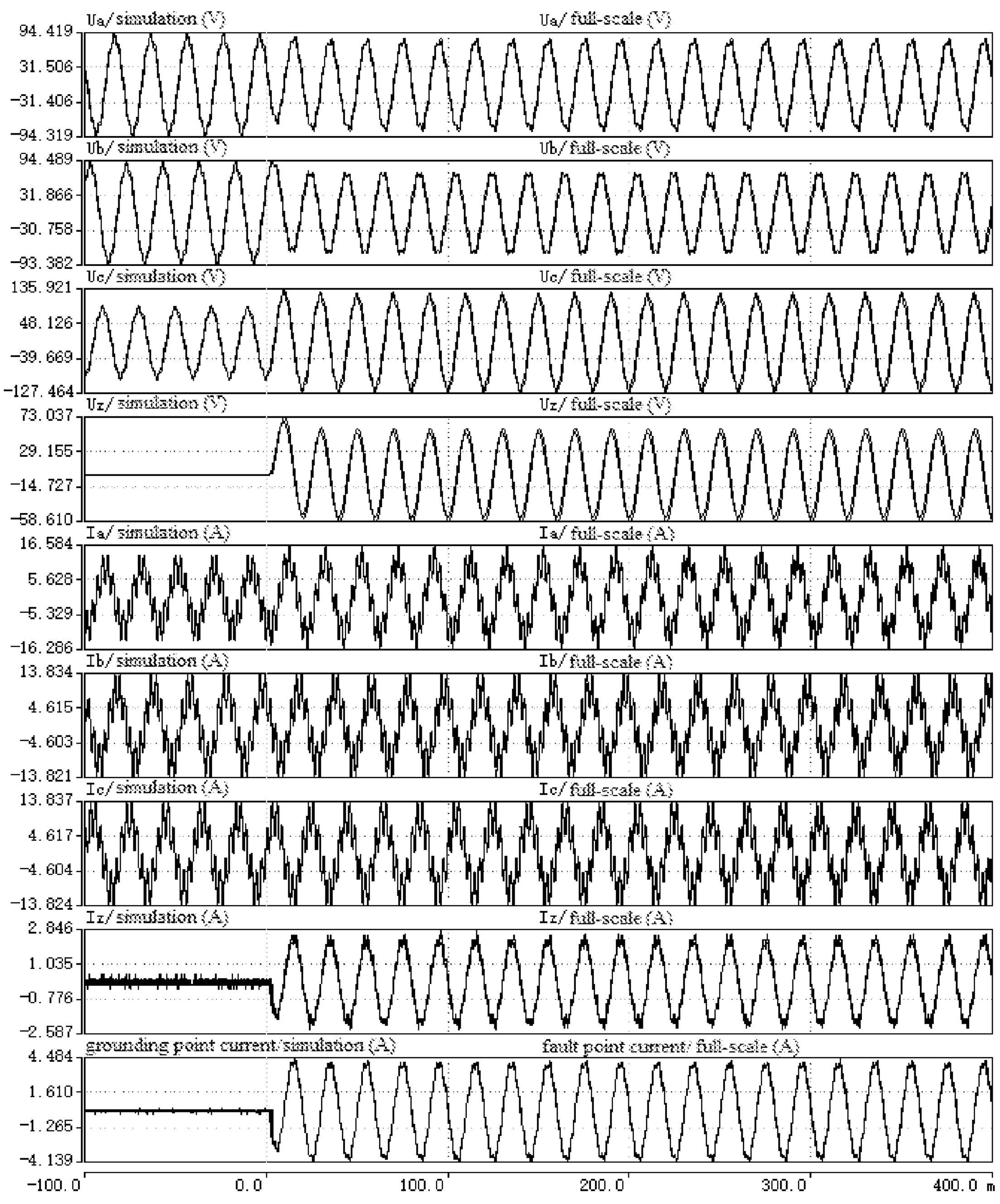
FIG. 12 is a full-scale simulated waveform comparison diagram of a 20000 ground fault with neutral ungrounded according to some example embodiments of the disclosure.
Figure 13:
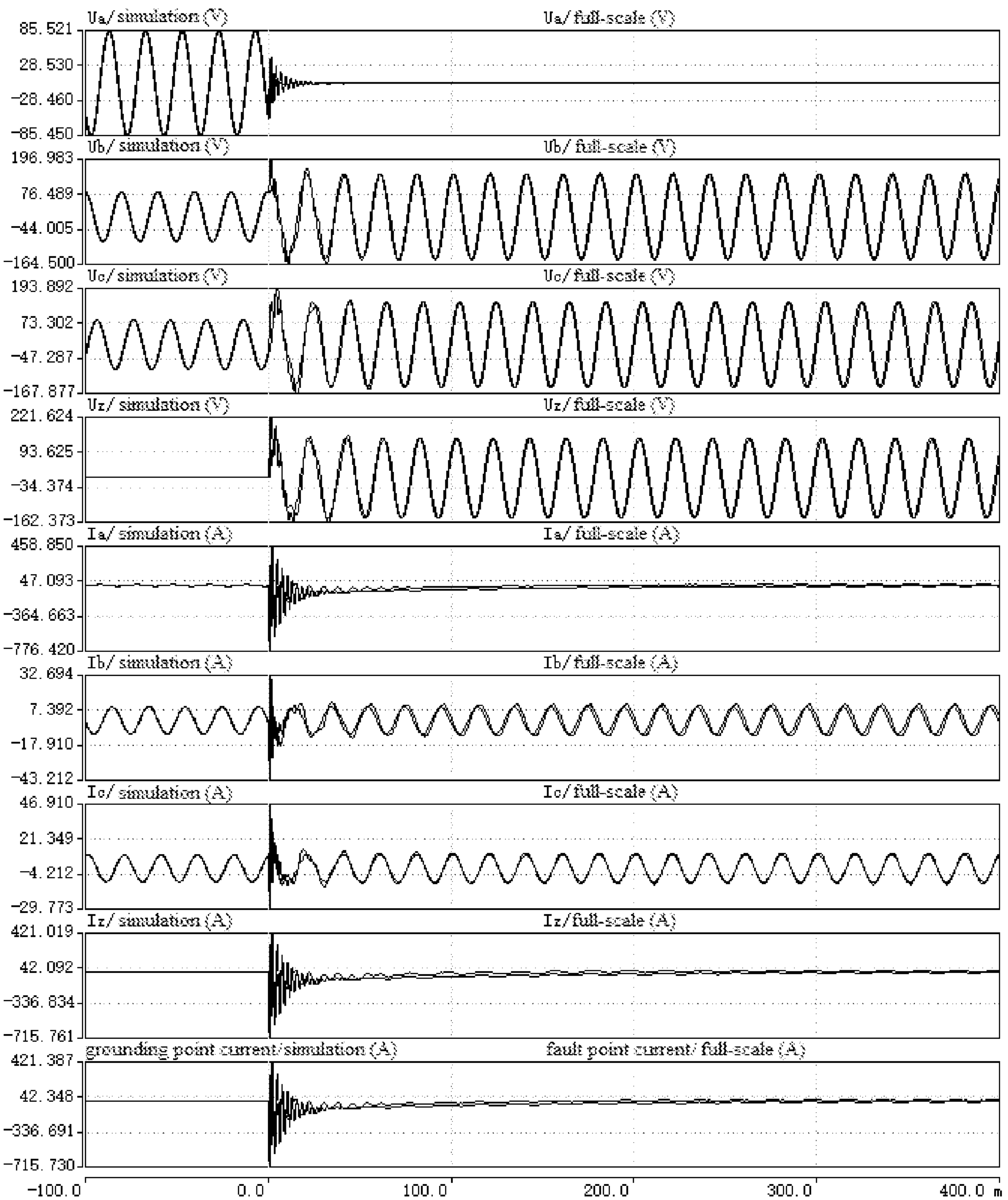
FIG. 13 is a full-scale simulated waveform comparison diagram of a metallic ground fault with neutral grounded via arc suppression coil according to some example embodiments of the disclosure.
Figure 14:
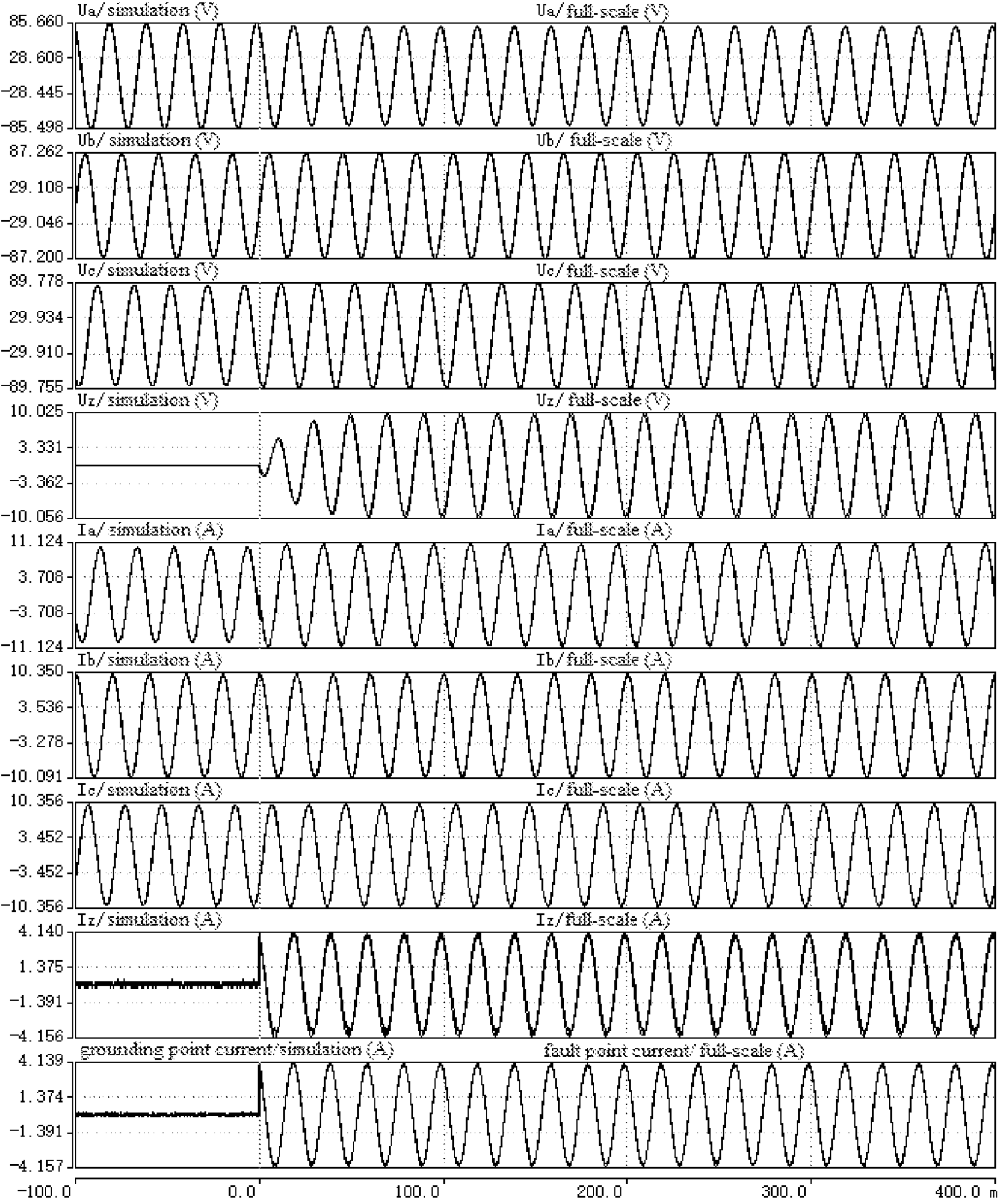
FIG. 14 is a full-scale simulated waveform comparison diagram of a 20000 ground fault with neutral grounded via arc suppression coil according to some example embodiments of the disclosure.
Figure 15:
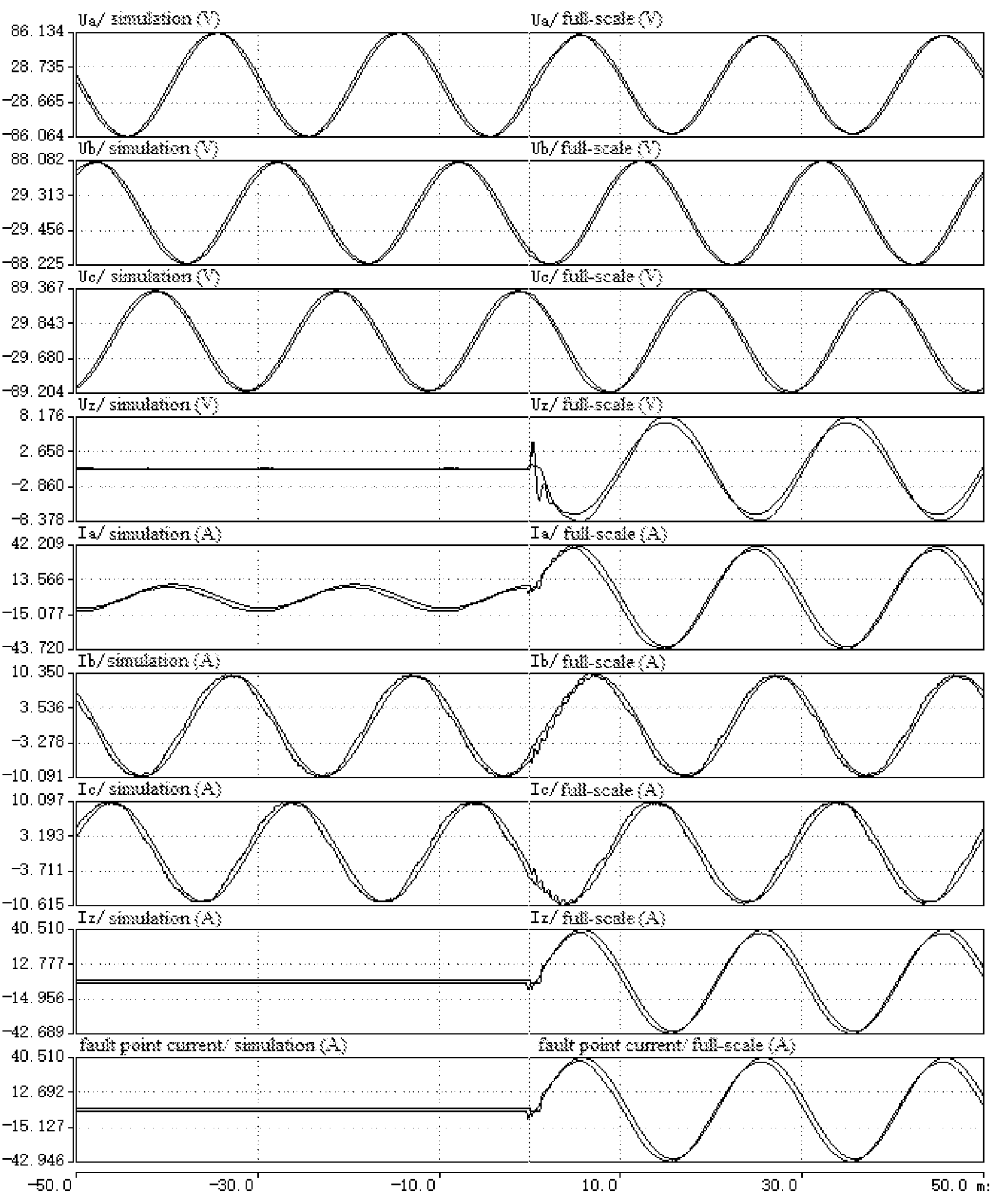
FIG. 15 is a full-scale simulated waveform comparison diagram of a metallic ground fault with neutral grounded via small resistance according to some example embodiments of the disclosure.
Figure 16:
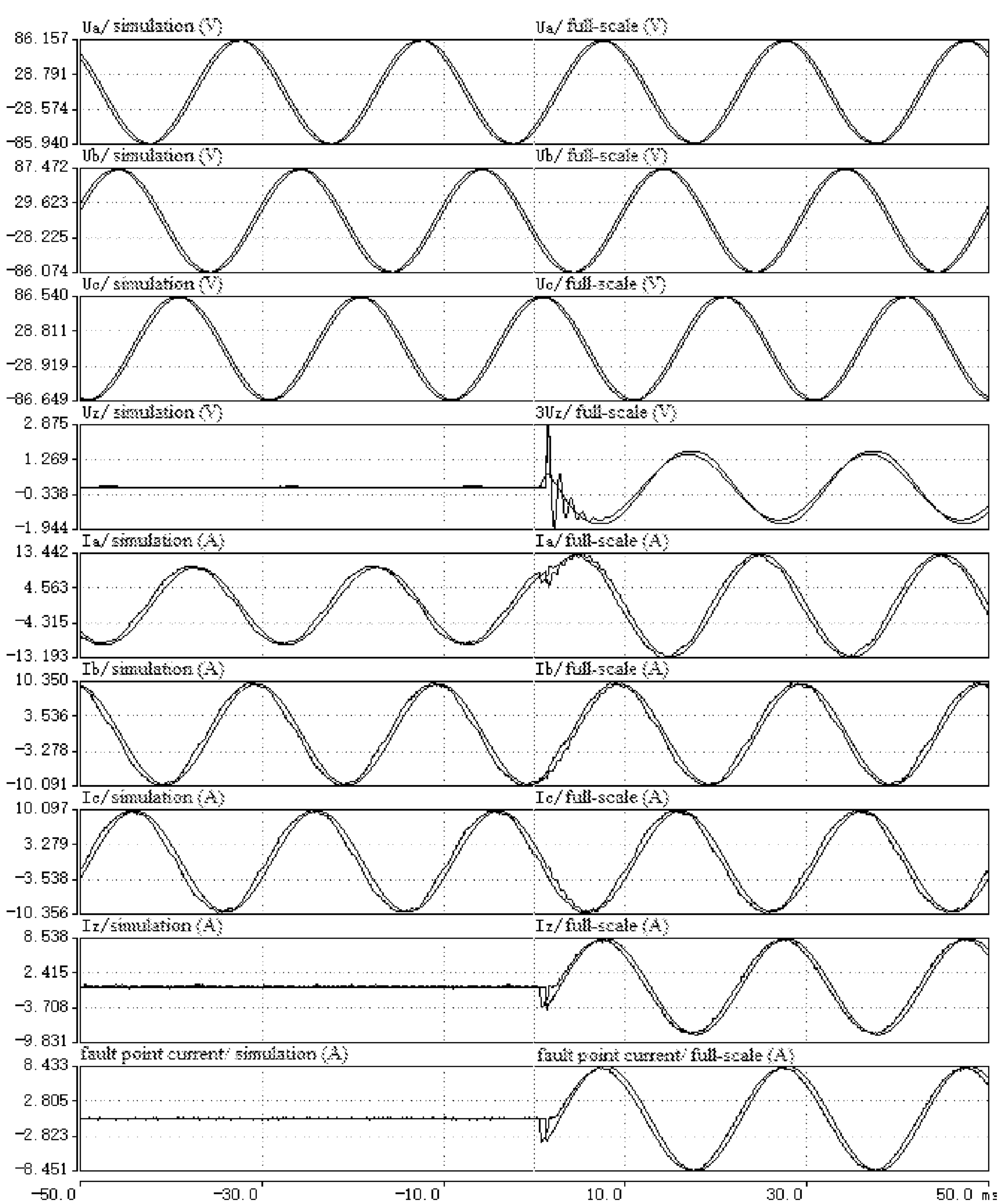
FIG. 16 is a full-scale simulated waveform comparison diagram of a 20000 ground fault with neutral grounded via small resistance according to some example embodiments of the disclosure.

To ensure a good conformance between the recorded waveforms of the ground fault of the simulation model and the recorded waveforms of the full-scale ground fault, a metallic ground fault and a ground fault via 2 kΩ transition resistance are sequentially tested and their waveforms are compared under the circumstances of distribution network neutral ungrounded, distribution network neutral grounded via arc suppression coil, and distribution network neutral grounded via small resistance, respectively. The comparison results are shown in FIGS. 11 to 16, where FIG. 11 is a full-scale simulated waveform comparison diagram of a metallic ground fault with neutral ungrounded according to some example embodiments of the disclosure: FIG. 12 is a full-scale simulated waveform comparison diagram of a 2000Ω ground fault with neutral ungrounded according to some example embodiments of the disclosure; FIG. 13 is a full-scale simulated waveform comparison diagram of a metallic ground fault with neutral grounded via arc suppression coil according to some example embodiments of the disclosure; FIG. 14 is a full-scale simulated waveform comparison diagram of a 2000Ω ground fault with neutral grounded via arc suppression coil according to some example embodiments of the disclosure: FIG. is a full-scale simulated waveform comparison diagram of a metallic ground fault with neutral grounded via small resistance according to some example embodiments of the disclosure; FIG. 16 is a full-scale simulated waveform comparison diagram of a 2000Ω ground fault with neutral grounded via small resistance according to some example embodiments of the disclosure.

The simulation model built according to the method comprises following simulation blocks classified as per sub-functions: an alternating-current AC (Alternating Current) equivalent power grid simulation block, a network topology simulation block, a system load simulation block, and a fault point simulation block, which are configured to implement simulations of respective simulation sub-functions based on the external characteristic parameters.

(1) AC Equivalent Power Grid Simulation Block

The AC equivalent power grid simulation block mainly dictates amplitude and frequency of busbar voltage of the distribution network. Steady-state amplitude and frequency of the busbar voltage of the full-scale testing site may be obtained based on the steady-state range of recorded waves of the full-scale ground fault testing site, whereby the amplitude and frequency of the AC equipment distribution network may be calculated by backstepping, thereby completing simulation modeling of the AC equivalent power grid.

The voltage amplitude and frequency are given by $$U_{LineRTDS} = k1 * k2 * U_{LineMea},$$

where $U_{LineRTDS}$ denotes the first-order rated value of the line voltage in the AC equivalent power grid block, with a unit of kV; $U_{LineMea}$ denotes the second-order measured value of the 10 kV busbar voltage of the full-scale testing site, with a unit of V; k1 is defined as PT transformation ratio of the 10 kV busbar of the full-scale testing site, with a typical value k1=10 kV/100V; k2 is defined as the transformation ratio of the step-down transformer, with a typical value k2=110 kV/10 kV; and $$f_{LineRTDS} = f_{LineMea}$$

where $f_{LineRTDS}$ denotes the rated frequency value in the AC equivalent power grid block, with a unit of Hz; and $f_{LineMea}$ denotes the measured frequency value of the 10 kB busbar voltage of the full-scale testing site, with a unit of Hz.

Through the equations adopted in calculation of the modeling process, the rated line voltage and the rated frequency in the AC equivalent power grid block in the RTDS are set: since they are conformant with the values derived from backstepping calculation, no other variables need to be supplemented.

(2) Network Architecture Topology Simulation Block

Figure 17:
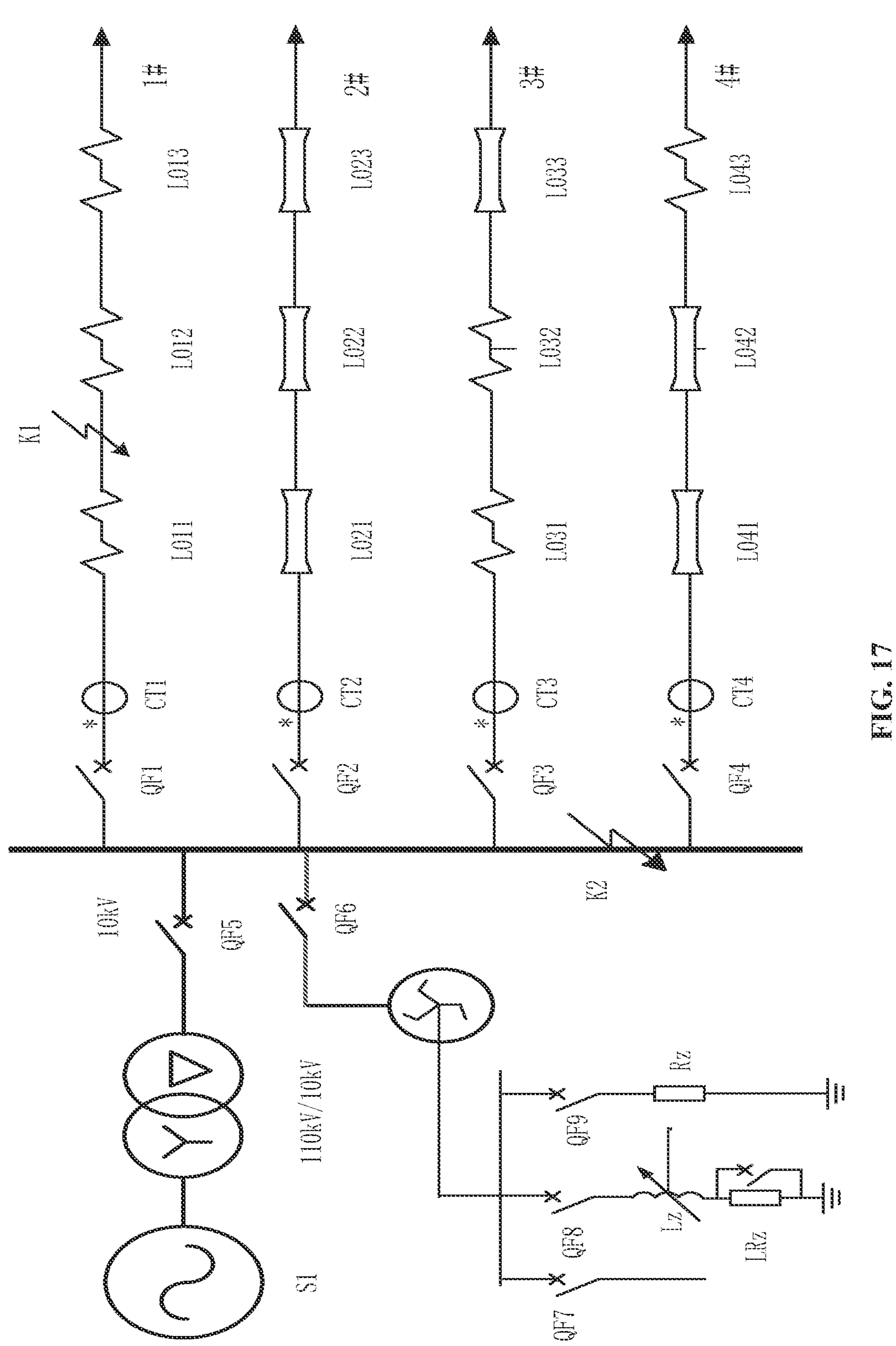
FIG. 17 is a structural schematic diagram of a network architecture topology according to some example embodiments of the disclosure.

The distribution network architecture topological structure of the simulation system is configured with reference to the actual condition of the full-scale testing site, as illustrated in FIG. 17. FIG. 17 is a structural schematic diagram of a network architecture topology according to some example embodiments of the disclosure, mainly comprising: an AC equivalent power source (S1), a 110 kV/10 kV step-down transformer (T1), a grounding transformer (T2), an arc suppression coil (Lz), a small resistance (Rz), 4 feeder branches (1 #-4 #branches), and loads (1 #load-4 #load).

Respective elements in the network architecture topology simulation block are configured with reference to the parameters of the full-scale testing site. Typical distribution network connection topologies include: single radial connection, single-loop network connection, double radial connection, double-loop network connection, and counterradial connection. Example embodiments of the disclosure adopt the single radial connection method as described in the *Technical Specification of Full-Scale Single phase-to-ground Fault Test In* 10*kv Distribution Network*. No distribution parameter grain setting window is configured.

In the modeling process, it is needed to modify the rated capacity, rated voltage, connection manner, and zero-sequence impedance default value of the grounding transformer block in the RTDS so as to maintain conformance with the nameplate information of the full-scale test, without a need to supplement other variables. For example, Table 2 shows nameplate information of a full-scale grounding transformer.

TABLE 2

| Parameters | Unit | Parameter Value |
|---|---|---|
| Rated Capacity | kVA | 1300 |
| Rated Voltage | kV | 10.5/0.4 |
| Connection Manner | Unavailable | ZNyn11 |
| Zero-sequence Impedance | Ω/phase | 8.87 |

During the modeling process, it is needed to modify default values of the line blocks in the RTDS such as line length, positive-sequence resistance value, positive-sequence impedance value, positive-sequence capacitive reactance value, negative-sequence resistance value, negative-sequence impedance value, and negative-sequence capacitive reactance value so as to maintain conformant with line parameters of the full-scale test, or parameters of a typical distribution line are adopted, without a need to supplement other variables. System capacitive current parameters are emulated by adjusting lengths of respective feeder branches, and arc suppression coil compensation degree is controlled by adjusting parameters of the arc suppression coil. For example, Table 3 illustrates the capacitive current value and the arc suppression coil compensation degree of the full-scale testing site.

TABLE 3

| Neutral grounded manner | System capacitive current |
|---|---|
| Ungrounded | 7.5 A |
| Grounded via arc suppression coil | 110 A, overcompensation by 4.55% |
| Grounded via small resistance | 110 A |

Integrated design of the simulation model may be further developed based on the network architecture topology, whereby a universal distribution network simulation model is created, i.e., with a script file of the RTDS, automatic switching between modelings of network architecture for the ungrounded system, the arc suppression coil grounded system, and small resistance grounded system is enabled, and parameters of all elements can be preset. For example, under the ungrounded mode, the neutral point in the grounding transformer floats, i.e., QF8 and QF9 are opened; under the arc suppression coil grounded mode, the neutral point of the grounding transformer is connected to the arc suppression coil, i.e., QF8 is closed, and QF9 is opened: under the small resistance grounded mode, the neutral point in the grounding transformer is connected to the small resistance, i.e., QF8 is opened, and QF9 is closed.

(3) System Load Simulation Block

The RTDS simulation system may conveniently emulate the resistive load, inductive load, and capacitive load, etc. Load characteristics of the distribution line dictate the magnitude and power factor angle of the load current of the steady-state distribution line. To ensure conformance between the recorded waves of the ground fault of the simulation system and the recorded waves of ground fault of the full-scale test during the steady-state episode, the steady-state range of the recorded waves of the ground fault of the full-scale test is analyzed to deduce the external characteristics of the distribution line load, thereby correspondingly configuring the load parameters of the current line in the simulation system.

During the modeling process, it is needed to modify the RLC default value in the RTDS so as to keep conformant with the load parameters of the full-scale test, without a need to supplement other variables.

(4) Fault Point Simulation Block

In the distribution line ground fault simulation process, the RTDS simulation testing platform needs to emulate corresponding faults according to fault types of the full-scale testing site, respectively; example embodiments of the disclosure provide control logic for triggering of different fault points and emulating of different fault types in the simulation system.

Figure 18:
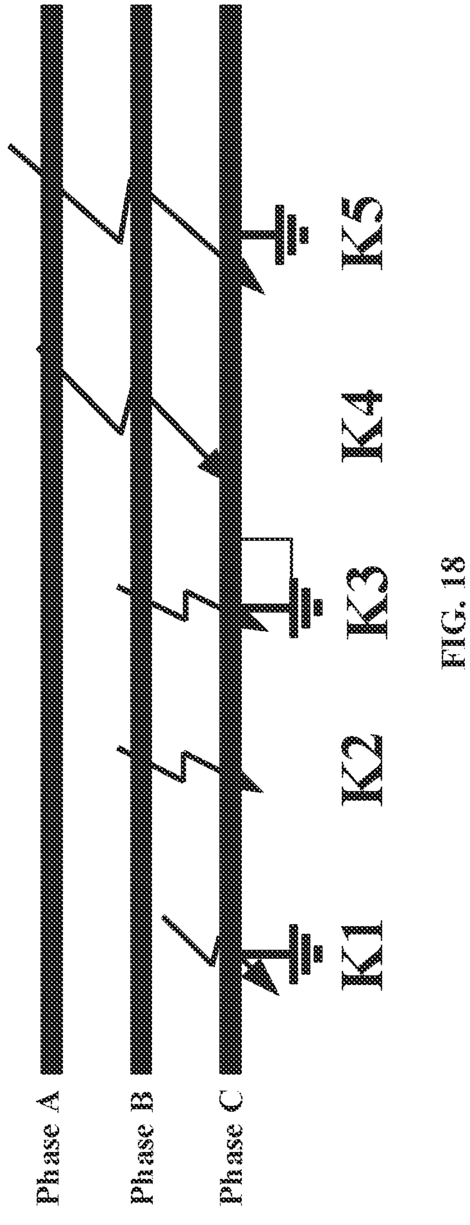
FIG. 18 is a schematic diagram of power system metallic fault types according to some example embodiments of the disclosure.

Common metallic fault types on the distribution line mainly include: single phase-to-ground metallic faults (AN, BN, CN), two phase short-circuit faults (AB, BC, CA), two-phase short-circuit ground faults (ABN, BCN, CAN), three-phase short-circuit faults (ABC), and three-phase short-circuit ground fault (ABCN), totally 11 faulty operational conditions in 4 classes, as illustrated in FIG. 18. FIG. 18 is a schematic diagram of power system metallic fault types according to some example embodiments of the disclosure, where point K1 denotes CN single phase-to-ground fault: K2 denotes BC phase-to-phase short-circuit fault; K3 denotes BCN phase-to-phase short-circuit ground fault: K4 denotes ABC phase-to-phase short-circuit fault, and K5 denotes ABCN three-phase short-circuit ground fault. The essence of different fault types of fault points lies in different short-circuit arrangements between fault points A, B, C and the ground point; therefore, emulation of fault types needs to adopt a set of trigger control logics based on different fault type needs to realize different corresponding arrangements.

Figure 19:
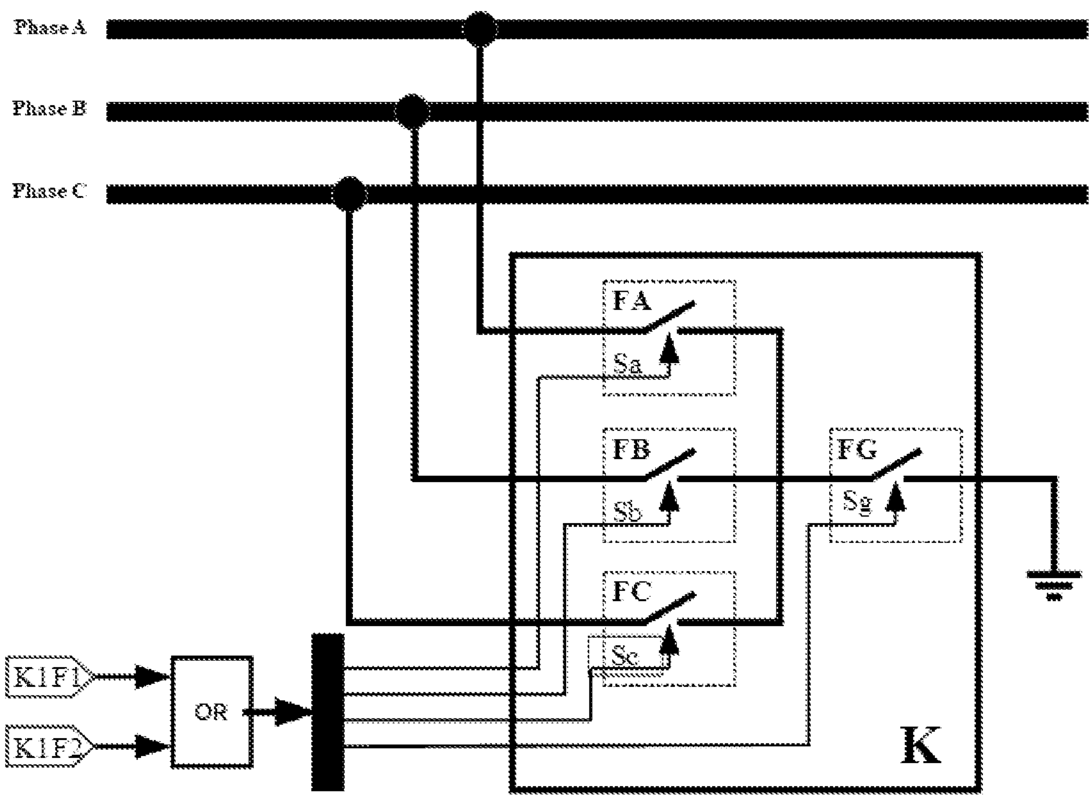
FIG. 19 is an equivalent structural schematic diagram of fault types of a fault point according to some example embodiments of the disclosure.

Fault Point Trigger and Fault Type Control Logic:

FIG. 19 is an equivalent structural schematic diagram of fault types of a fault point according to some example embodiments of the disclosure, where the black box K denotes a fault type emulation block comprising four circuit-breakers FA, FB, FC, and FG, where Sa, Sb, Sc, and Sg denote control signal terminals corresponding to the four circuit-breakers, respectively. K1F1 and K1F2 are fault type controlwords of fault point K1, which are 4-bit binary numbers, sequentially representing signal values of S1, Sb, Sc, and Sg from higher level to lower level. For example, when emulating the AN single-phase fault type, the controlword K1F1 is "1001," i.e., FA and FG circuit-breakers are closed; when simulating the CAN phase-to-phase short-circuit type, the controlword K1F1 is "1011," i.e., FA, FC, and FG circuit-breakers are closed.

When the system operates normally and no fault occurs, the controlword is "0001" or "0000," i.e., the circuit-breakers FA. FB, and FC maintain an open state. Simulation and emulation of different fault types may be implemented by controlling change of K1F1 or K1F2 number and time of change, where K1F1 denotes the first fault triggering controlword, K1F2 denotes the secondary fault triggering controlword, and combination of the two may implement simulation and emulation of a transition fault type.

Figure 20:
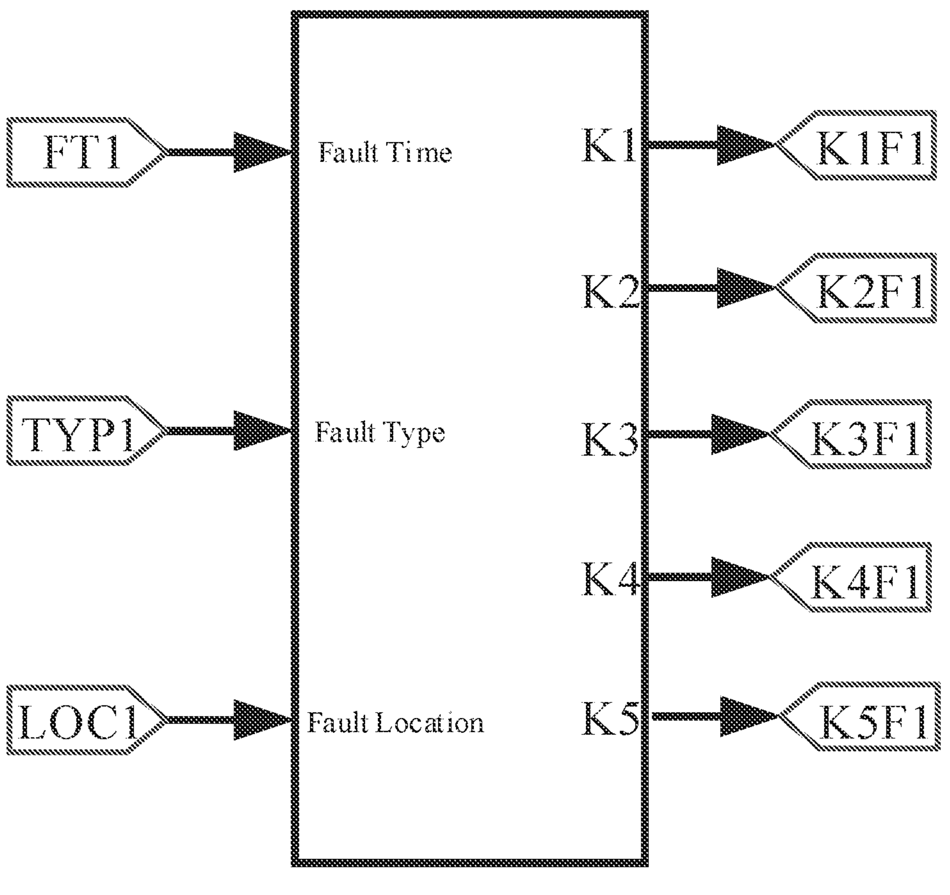
FIG. 20 is a schematic diagram of a trigger logic module for fault type control words according to some example embodiments of the disclosure.

FIG. 20 is a schematic diagram of a trigger logic module for fault type controlwords according to some example embodiments of the disclosure, where FT1 denotes the fault duration input terminal (e.g., 20 ms, 100 ms, etc.); TYP1 denotes the first fault type input terminal (e.g., 1, 2, 3, 4, 5, etc.); LOCI denotes a fault point input value (e.g., 1, 2, 3, 4, 5, etc.); and K1F1~K5F1 denote first fault triggering controlwords for fault points 1-5, respectively.

Figure 21:
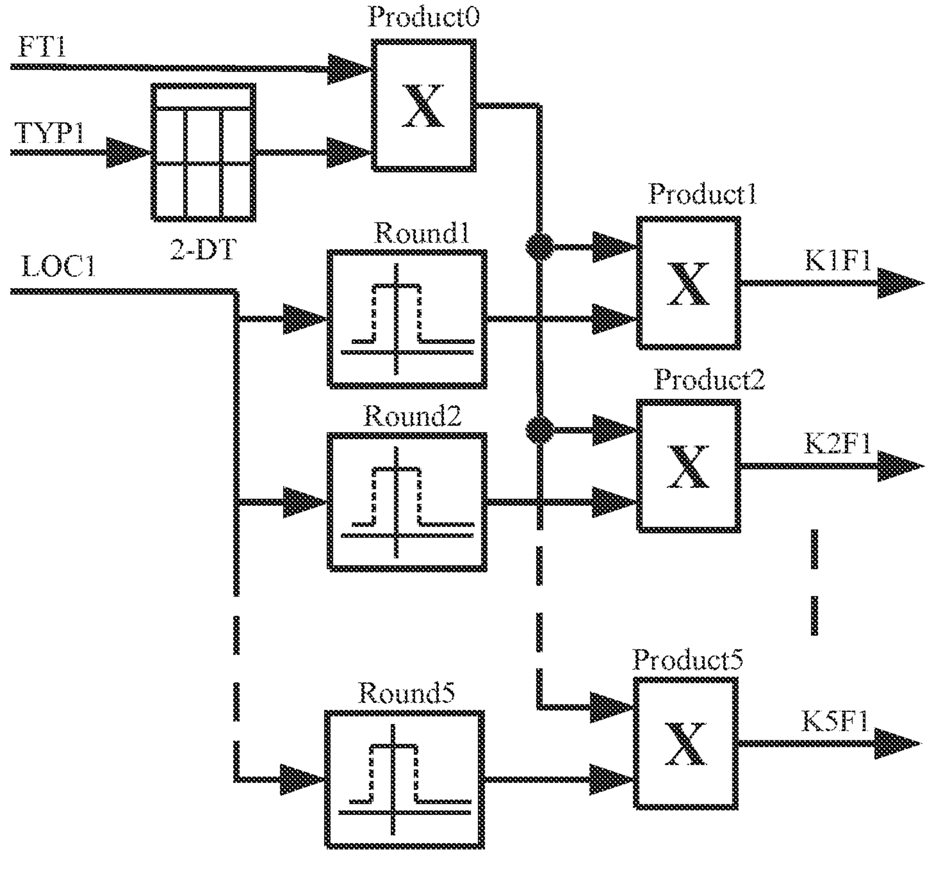
FIG. 21 is a schematic diagram of fault type trigger control logic according to some example embodiments of the disclosure.

FIG. 21 is a schematic diagram of fault type trigger control logic according to some example embodiments of the disclosure, where 2-DT is an array table including binary controlwords representing different fault types, the contents of which are shown in Table 4 below. The fault duration FT1 is a pulse-width signal, which, after being subjected to "AND" operation with the fault type selected to output by TYP1, is outputted to the next "AND" operation module. The zero-crossing point of the fault phase is located and the rising edge time of FT1 is controlled with the zero-crossing time as the clocking start point, whereby fault trigger angle control of the single phase-to-ground fault is realized.

TABLE 4

| No. | Binary number | Fault type |
|---|---|---|
| 1 | 0000 | No fault |
| 2 | 1001 | AN single phase-to-ground fault |
| 3 | 1100 | AB phase-to-phase short-circuit fault |
| 4 | 1011 | CAN phase-to-phase short-circuit ground fault |
| 5 | 1110 | ABC three-phase short-circuit fault |

Based on the introductions above, simulation modeling of fault point control is completed in the RTDS simulation model. Specific parameters include: fault point setting, fault type setting, fault duration setting, and fault trigger angle setting. The fault point location may be arbitrarily set based on test needs, e.g., header of the line, end of the line, middle of the line, and busbar fault. Typical fault locations recommended include busbar, header of the line, end of the line, and middle of the line. The fault control module is a basic ground fault control module, which cannot emulate a rotating gap electrode method-based intermittent arc grounding fault, a compound fault, or a break fault as set forth in the Technical Specification of Full-Scale Single phase-to-ground Fault Test in kV Distribution Network.

Figure 22:
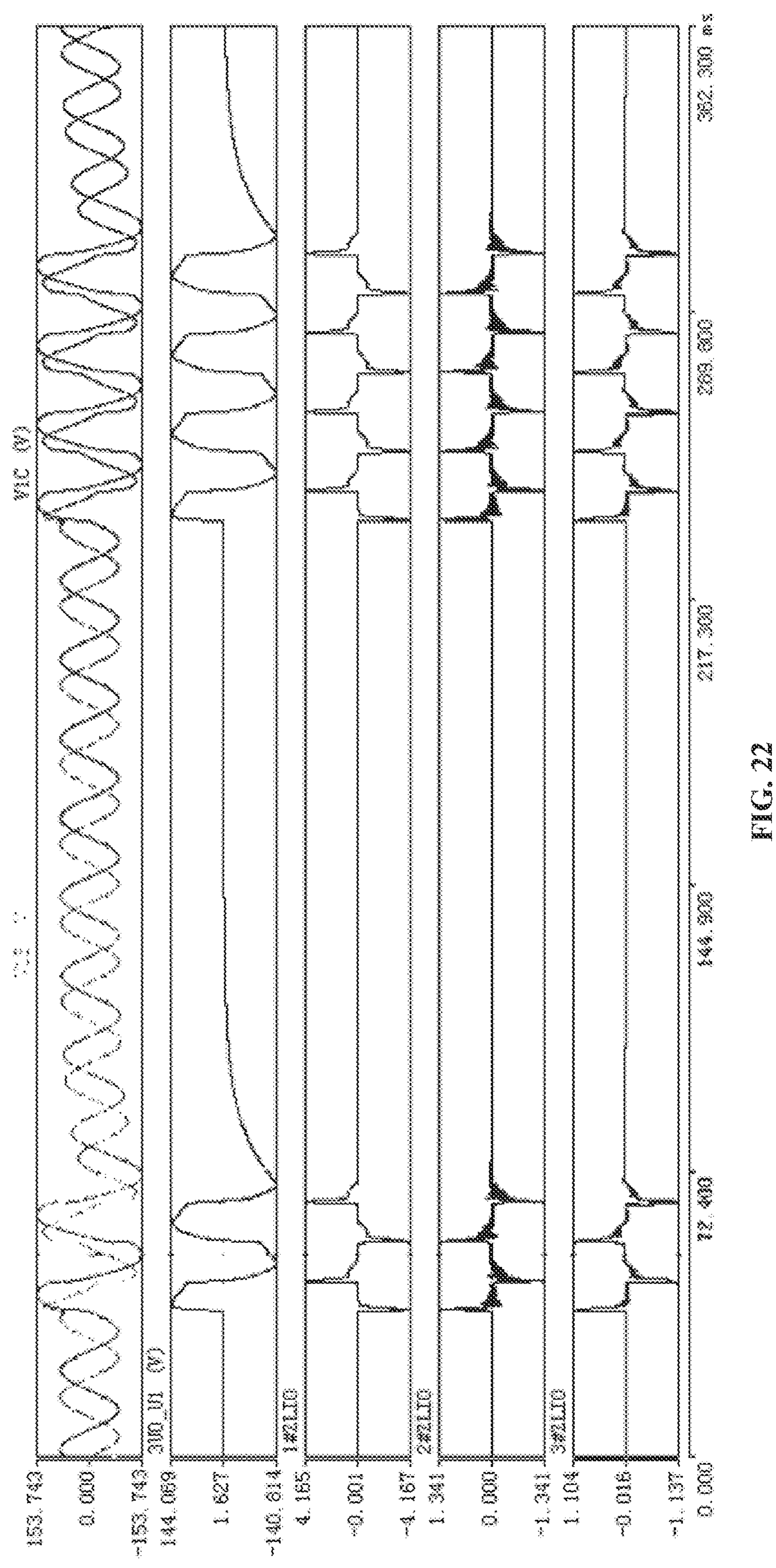
FIG. 22 is a recorded waveform diagram of intermittent arc grounding according to some example embodiments of the disclosure.

Emulation of the arcing ground fault refers to the DL/T 872-2016: Specification for Single Phase-to-Ground Fault Selection Device in Neutral Point Non-Effectively Grounded System. In case of arcing ground, within each half industrial frequency cycle, the system is switched on when the voltage is higher than specified value U1 and switched off when the voltage is lower than specified value U2, where U1=0/9 (per-unit value) and U2=0.2 (per-unit value), U1=0.9 is equivalent to conduction angle 64.16°, and U2=0.2 is equivalent to extinction angle 168.5°. In case of the intermittent arc grounding, the system is switched on within n industrial frequency cycles, and switched off within m industrial frequency cycles, where n and m may be combined as such: n=3, m=2: n=3, m=1; n=2, m=1; n=1, m=1. For example, FIG. 22 is a recorded waveform diagram of intermittent arc grounding according to some example embodiments of the disclosure.

The example embodiments above have described in detail a method of building s simulation model for the computerized simulation validating method for a full-scale distribution network single phase-to-ground fault test; the model can obtain recorded waves of the simulation testing corresponding to the full-scale test based on quantitative control of different external quantities, which facilitates comparison between a full-scale testing result and a simulation testing result in terms of internal quantities, thereby improving normalization and conformance of the full-scale distribution network single phase-to-ground fault test.

In the example embodiments above, a computerized simulation validating method for a full-scale distribution network single phase-to-ground test has been described in detail. The disclosure further provides example embodiments corresponding to a computerized simulation validating apparatus for a full-scale distribution network single phase-to-ground test. It is noted that the apparatus embodiments are described herein from two perspectives, i.e., from the perspective of functional blocks and from the perspective of hardware.

Figure 23:
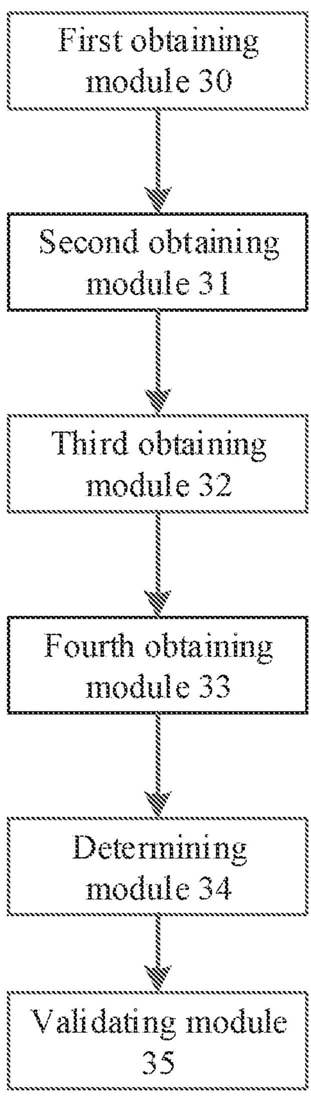
FIG. 23 is a schematic diagram of a computerized simulation validating system for a full-scale distribution network single phase-to-ground fault test according to some example embodiments of the disclosure.

From the perspective of functional blocks, FIG. 23 is a schematic diagram of a computerized simulation validating system for a full-scale distribution network single phase-to-ground fault test according to some example embodiments of the disclosure. As illustrated in FIG. 23, the computerized simulation validating system for a full-scale distribution network single phase-to-ground fault test according to some example embodiments of the disclosure comprises:

a first obtaining device 30 configured to obtain recorded waves of the field testing and external characteristic parameters of the full-scale distribution network single phase-to-ground fault test.

a second obtaining device 31 configured to obtain internal quantities of the field testing based on the recorded waveforms of the field testing;

a third obtaining device 32 configured to obtain recorded waveforms of simulation testing based on the external characteristic quantities;

a fourth obtaining device 33 configured to obtain internal quantities of the simulation testing based on the recorded waveforms of the simulation testing;

a determining device 34 configured to determine whether a field-testing result of the full-scale distribution network single phase-to-ground fault test is reproducible based on a relationship between the internal quantities of the field testing and the internal quantities of the simulation testing; and a validating device 35 is configured to validate the field testing of the full-scale distribution network single phase-to-ground fault test in case of the field-testing result being not reproducible.

Since example embodiments of the apparatus and example embodiments of the method correspond to each other, description of the example embodiments of the apparatus may refer to the example embodiments of the method, which will not be detailed here.

Figure 24:
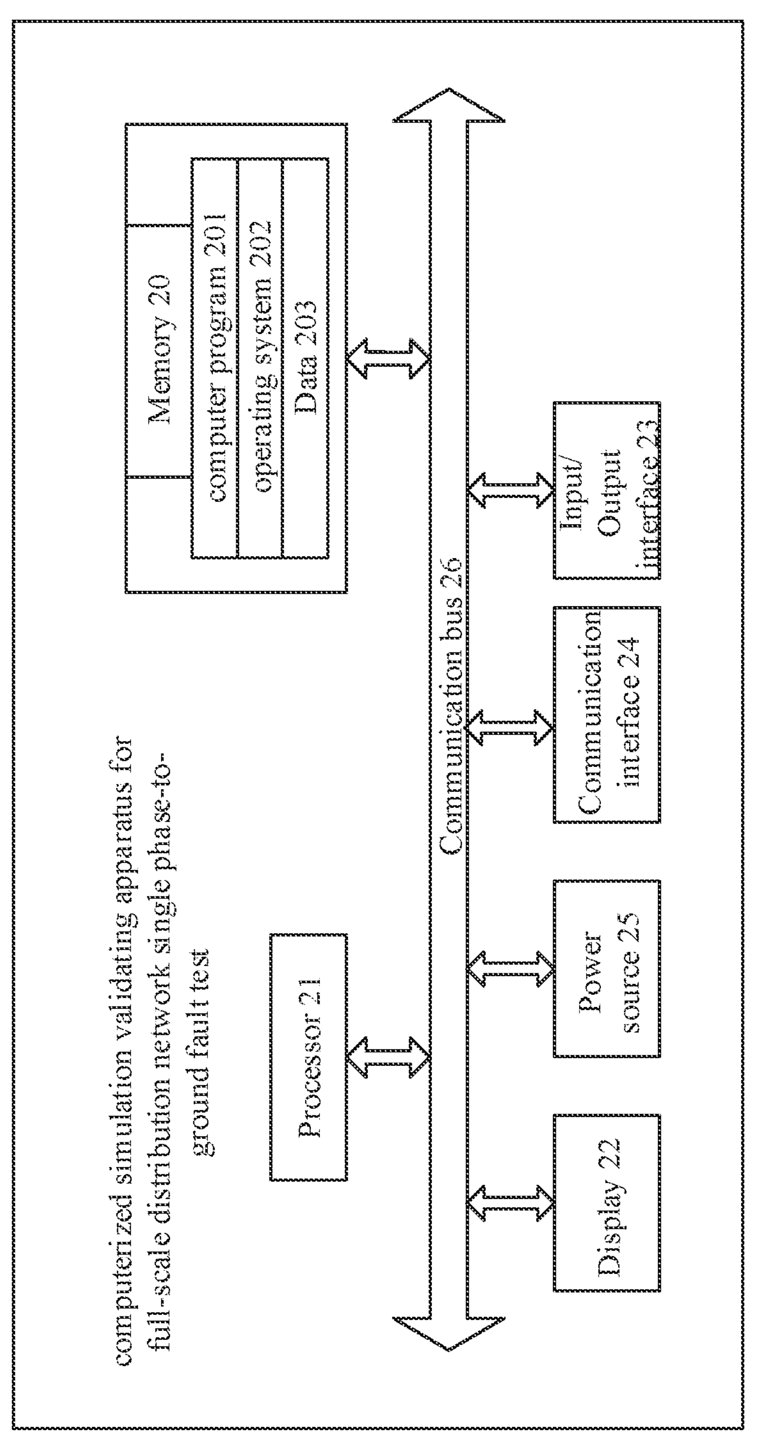
FIG. 24 is a structural diagram of a computerized simulation validating apparatus for a full-scale distribution network single phase-to-ground fault test according to some example embodiments of the disclosure.

FIG. 24 is a structural diagram of a computerized simulation validating apparatus for a full-scale distribution network single phase-to-ground fault test according to some example embodiments of the disclosure, which is described from hardware perspective. As illustrated in FIG. 24, the computerized simulation validating apparatus for a full-scale distribution network single phase-to-ground fault test according to some example embodiments of the disclosure comprises: a memory 20 configured to store a computer program:

a processor 21 configured to carrying out, when the computer program is executed, steps of the computerized simulation validating method for a full-scale distribution network single phase-to-ground test as described in the example embodiments above.

The computerized simulation validating apparatus for a full-scale distribution network single phase-to-ground fault test according to some example embodiments of the disclosure may include, but is not limited to, a smart phone, a tablet computer, a laptop computer, or a desktop computer, etc.

In this example embodiment, the processor 21 may comprise one or more processing cores, e.g., a 4-core processor, an 8-core processor, etc. The processor 21 may be implemented by at least one hardware form among a digital signal processor (DSP), a field-programmable gate array (FPGA), a programmable logic array (PLA). The processor 21 may also comprise a main processor and a co-processor, where the main processor refers to a processor configured to process data in an awake state, which is also referred to as a central processing unit (CPU); and the co-processor refers to a low power processor configured to process data in an idle state. In some example embodiments, the processor 21 may be integrated with a graphics processing unit (GPU), which is configured to render and plot contents that need to be displayed on a display. In some example embodiments, the processor 21 may further comprise an artificial intelligence (AI) processor, which is configured to process computational operations regarding machine learning.

The memory 20 may comprise one or more computer-readable memory mediums. The computer-readable memory mediums may be non-transient. The memory may further comprise a high-speed random-access memory, and a non-volatile memory, e.g., one or more magnetic disc memory devices, flash memory devices. In this example embodiment, the memory 20 is at least configured to store a computer program 201 below, where the computer program, after being loaded and executed by the processor 21, can carry out relevant steps of the computerized simulation validating method for a full-scale distribution network single phase-to-ground fault test disclosed in any example embodiments described above. In addition, resources stored in the memory may further comprise an operating system 202 and data 203, etc., where the memory manner may be short-term memory or permanent memory. Specifically, the operating system 202 may include Windows, Unix, Linux, etc. The data 203 may include, but are not limited to, internal quantities and external quantities.

In some example embodiments, the computerized simulation validating apparatus for a full-scale distribution network single phase-to-ground fault test may further comprise a display 22, an input/output interface 23, a communication interface 24, a power source 25, and a communication bus 26.

Those skilled in the art may understand that the structure illustrated in FIG. 24 does not constitute a limitation to the computerized simulation validating apparatus for a full-scale distribution network single phase-to-ground fault test, which may include more or less components than what are illustrated.

The computerized simulation validating apparatus for a full-scale distribution network single phase-to-ground fault test according to some example embodiments comprise a memory and a processor, where the processor, when executing the program stored in the memory, can carry out the method below: a computerized simulation validating method for a full-scale distribution network single phase-to-ground fault test.

Finally, the disclosure further provides an example embodiment corresponding to a computer-readable memory medium, where a computer program is stored on the computer-readable memory medium, such that the computer program, when being executed by the processor, carries out the steps described in the method embodiments.

It is understood that if the method described in the example embodiments above is implemented as a software function unit and sold or used as a standalone product, it may be stored in a computer-readable memory medium. Based on such understanding, the technical solution of the disclosure in its essence, or the part contributing to conventional technologies, or all or part of the technical solution, may be embodied as a software product, while the computer software product is stored in a memory medium to carry out all or part of the method described in various example embodiments of the disclosure. The memory medium includes various mediums capable of storing program codes, such as a U disk, a mobile hard disk, a read-only memory (ROM), a random-access memory (RAM), a magnetic disc, or a CD.

Detailed description has been made to computerized simulation validating method, system, apparatus, and medium for a full-scale distribution network single phase-to-ground fault test. The example embodiments in the specification are described in a progressive manner, where each example embodiment focuses on differences from other example embodiments, and same or similar portions between the example embodiments may refer to each other. For the apparatus embodiments, they are corresponding to the method embodiments and are thus described relatively simply; therefore, relevant portions may refer to the description of method embodiments. It is noted that to those skilled in the art, the disclosure may also be subjected to alterations and modifications within depart from the principle of the disclosure, while such alterations and modifications also fall within the protection scope of the claims appended below.

It is further noted that in the specification, relational terms such as first and second are only used to distinguish one entity or operation from another entity or operation, rather than requiring or implying any actual relation or order present between these entities or operations. Moreover, the terms "include," "comprise," or any other variants are intended for a non-exclusive inclusion, such that a process, a method, an article or a device including a series of elements not only include such elements, but also include other unidentified elements, or elements inherent to the process, method, article or device. Without further limitations, an element limited by "comprising one . . . " does not exclude presence of other same elements in the process, method, article or device comprise the element.

What is claimed is:

1. A method of correctively adjusting a test configuration of a full-scale distribution network single phase-to-ground fault test, implemented by a real-time digital simulator (RTDS) comprising a processor implemented by at least one of a digital signal processor (DSP), a field-programmable gate array (FPGA), or a programmable logic array (PLA), and a communication interface coupled to measurement devices installed at a full-scale distribution network single phase-to-ground fault test site, the method comprising:

obtaining, by the RTDS from Common Format for Transient Data Exchange (COMTRADE) waveform files generated by the measurement devices, recorded waveforms and external characteristic parameters of field testing of the full-scale distribution network single phase-to-ground fault test;

obtaining, by the RTDS using Fast Fourier Transform (FFT)-based signal-processing algorithms, internal quantities of the field testing based on the recorded waveforms of the field testing;

building, by the RTDS, a real-time simulation model of the distribution network that comprises an equivalent power source, a step-down transformer, a grounding transformer, an arc suppression coil, a distribution line, a circuit load, and a fault trigger control module, by:

adjusting parameters of the equivalent power source and the step-down transformer to maintain conformance with pre-fault phase voltage and pre-fault phase current values obtained from the recorded waveforms of the field testing, and adjusting a magnitude of the circuit load to maintain conformance with a pre-fault phase current value;

adjusting parameters of the distribution line to maintain conformance between a system capacitive current of the simulation model and a system capacitive current value of the external characteristic parameters;

controlling a fault trigger angle of the simulation model to conform with a fault trigger angle obtained from the recorded waveforms of the field testing; and iteratively emulating occurrence of a ground fault in the simulation model and recording simulated waveforms, computing a waveform conformance metric between the simulated waveforms and the recorded waveforms of the field testing, and adjusting at least one of a fault point location and a ground fault resistance value of the simulation model based on the waveform conformance metric, until the waveform conformance metric satisfies a predefined conformance threshold, thereby achieving closed-loop calibration of the simulation model to the measured field-test behavior;

obtaining, by the RTDS, recorded waveforms of simulation testing based on the external characteristic parameters by inputting the external characteristic parameters into a real-time simulation model of the distribution network that comprises an equivalent power source, a step- down transformer, a grounding transformer, an arc suppression coil, a distribution line, a circuit load, and a fault trigger control module, and executing the simulation model in real time;

obtaining, by the RTDS using the FFT-based signal-processing algorithms, internal quantities of the simulation testing based on the recorded waveforms of the simulation testing;

determining, by the RTDS, whether a field-testing result of the full-scale distribution network single phase-to-ground fault test is reproducible based on a relationship between the internal quantities of the field testing and the internal quantities of the simulation testing that includes verifying conformance of at least one unconventional quantity selected from negative-sequence current, line dielectric loss, phase current change, and multi-harmonic zero-sequence admittance;

validating the field testing of the full-scale distribution network single phase-to-ground fault test in case of the field-testing result being not reproducible by:

outputting a validation result indicating whether the field test setup satisfies a predefined normative criterion for full-scale ground fault testing;

identifying at least one external characteristic parameter that fails to satisfy the predefined normative criterion; and correctively adjusting at least one physical device selected from the group consisting of a circuit load, an arc suppression coil, a grounding transformer, or a fault trigger control module of the full-scale distribution network single phase-to-ground fault test site based on the identified external characteristic parameter, wherein the external characteristic parameters comprise system capacitive current value, harmonic content, load condition, ground fault resistance value, and ground fault trigger angle, wherein the internal quantities comprise three dimensions of steady-state quantities, transient quantities, and unconventional quantities, wherein the unconventional quantities comprise negative-sequence current, line dielectric loss, phase current change, and multi-harmonic zero-sequence admittance.

2. The method of claim 1, wherein the steady-state quantities comprise: zero-sequence current and line zero-sequence admittance; and the transient quantities comprise: harmonic current and transient zero-sequence component.

3. The method of claim 1, further comprising:

before the determining, preprocessing the recorded waves of the field testing and the recorded waves of the simulation testing, respectively.

4. The method of claim 1, wherein the obtaining recorded waves of the simulation testing based on the external characteristic parameters comprises:

inputting the external characteristic parameters into a simulation model; and obtaining the recorded waves of the simulation testing formed from the simulation model;

wherein a method of building the simulation model comprises:

building the simulation model based on standard parameters of a standard full-scale distribution network single phase-to-ground fault testing site and the recorded waveforms of a full-scale ground fault;

wherein independent variables of the simulation model are the external characteristic parameters, and dependent variables thereof are the recorded waves of the simulation testing.

5. The method of claim 4, wherein the simulation model comprises: an equivalent power source, a step-down transformer, a grounding transformer, an arc suppression coil, a distribution line, a circuit load, and a fault trigger control module;

wherein the method of building the simulation model based on standard parameters of the standard full-scale distribution network single phase-to-ground fault testing site and the recorded waveforms of the full-scale ground fault comprises:

adjusting parameters of the equivalent power source and the step-down transformer to maintain conformance with a value of pre-fault phase voltage, and adjusting a magnitude of the circuit load to maintain conformance with a value of pre-fault phase current;

adjusting parameters of the distribution line to maintain conformance between a system capacitive current of the simulation model and a system capacitive current of the standard full- scale distribution network single phase-to-ground fault testing site;

completing simulation modeling of the grounding transformer in the simulation model based on grounding transformer nameplate information of the standard full-scale distribution network single phase-to-ground fault testing site;

completing simulation modeling of the arc suppression coil in the simulation model based on arc suppression coil nameplate information of the standard full-scale distribution network single phase-to-ground fault testing site;

determining a ground fault resistance value of the simulation model based on a ground fault resistance value of the standard full-scale distribution network single phase-to-ground fault testing site; setting a ground fault point location of the simulation model based on fault point location information of the standard full-scale distribution network single phase-to-ground fault test;

obtaining a full-scale fault trigger angle based on recorded waves of a ground fault of the standard full-scale distribution network single phase-to-ground fault test, and controlling a fault trigger angle of the simulation model to be conformant with the full-scale fault trigger angle; and completing simulation modeling of the fault trigger control module in the simulation model;

emulating occurrence of ground fault to the simulation model and recording waves, and determining whether the recorded waveforms of the ground fault of the simulation model and the recorded waveforms of the full-scale ground fault are conformant; and in case of being not conformant, adjusting the fault point location or the ground fault resistance value based on a comparison result, and returning to the step of emulating occurrence of ground fault to the simulation model and recording waves, till the recorded waveforms of the ground fault of the simulation model and the recorded waveforms of the full-scale ground fault are conformant;

wherein simulation blocks classified as per sub-functions of the simulation model built according to the method comprises: an alternating-current AC equivalent power grid simulation block, a network topology simulation block, a system load simulation block, and a fault point simulation block, which are configured to implement simulations of respective simulation sub-functions based on the external characteristic parameters.

6. A computerized simulation validating apparatus for a full-scale distribution network single phase-to-ground fault test, comprising:

a memory storing instructions; and a processor configured to carry out, when the instructions are executed, the method of claim 1.

7. A non-transitory computer-readable memory medium storing instructions that, when being executed by a processor, cause the processor to perform the method of claim 1.

8. A computerized simulation validating system for a full-scale distribution network single phase-to-ground fault test, comprising:

a memory storing instructions; and one or more processors configured to execute the instructions to cause the system to:

obtain recorded waveforms and external characteristic parameters of field testing of the full-scale distribution network single phase-to-ground fault test;

obtain internal quantities of the field testing based on the recorded waveforms of the field testing;

obtain recorded waveforms of simulation testing based on the external characteristic parameters;

obtain internal quantities of the simulation testing based on the recorded waveforms of the simulation testing;

determine whether a field-testing result of the full-scale distribution network single phase-to-ground fault test is reproducible based on a relationship between the internal quantities of the field testing and the internal quantities of the simulation testing; and validate the field testing of the full-scale distribution network single phase-to-ground fault test in case of the field-testing result being not reproducible by:

outputting a validation result indicating whether the field test setup satisfies a predefined normative criterion for full-scale ground fault testing;

identifying at least one external characteristic parameter that fails to satisfy the predefined normative criterion; and correctively adjusting at least one physical device selected from the group consisting of a circuit load, an arc suppression coil, a grounding transformer, or a fault trigger control module of the full-scale distribution network single phase-to-ground fault test site based on the identified external characteristic parameter, wherein the external characteristic parameters comprise: system capacitive current value, harmonic content, load condition, ground fault resistance value, ground fault trigger angle;

wherein the internal quantities comprise three dimensions: steady-state quantities, transient quantities, and unconventional quantities; and wherein the unconventional quantities comprise: negative-sequence current, line dielectric loss, phase current change, and multi-harmonic zero-sequence admittance.

* * * * *